(12) United States Patent
Murakami et al.

(10) Patent No.: US 10,957,553 B2
(45) Date of Patent: Mar. 23, 2021

(54) ETCHING SOLUTION, ETCHING METHOD, AND METHOD FOR MANUFACTURING AN ELECTRONIC COMPONENT

(71) Applicant: KABUSHIKI KAISHA TOSHIBA, Minato-ku (JP)

(72) Inventors: Yukako Murakami, Chigasaki (JP); Masaaki Hirakawa, Yokohama (JP); Ikuo Uematsu, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/294,508

(22) Filed: Mar. 6, 2019

(65) Prior Publication Data
US 2019/0198344 A1   Jun. 27, 2019

Related U.S. Application Data

(63) Continuation of application No. PCT/JP2018/009795, filed on Mar. 13, 2018.

(30) Foreign Application Priority Data

Mar. 15, 2017 (JP) .............................. JP2017-050306

(51) Int. Cl.
*H01L 21/311* (2006.01)
*H01L 21/02* (2006.01)
(Continued)

(52) U.S. Cl.
CPC ........ *H01L 21/31111* (2013.01); *C09K 13/08* (2013.01); *H01L 21/02164* (2013.01);
(Continued)

(58) Field of Classification Search
None
See application file for complete search history.

(56) References Cited

U.S. PATENT DOCUMENTS

2008/0035609 A1   2/2008   Kashkoush et al.
2008/0064223 A1   3/2008   Eguchi et al.
(Continued)

FOREIGN PATENT DOCUMENTS

JP   2007-517413   6/2007
JP   2008-71801    3/2008
(Continued)

OTHER PUBLICATIONS

International Search Report dated May 29, 2018 in PCT/JP2018/009795 filed Mar. 13, 2018 (with English Translation).
(Continued)

*Primary Examiner* — Jiong-Ping Lu
(74) *Attorney, Agent, or Firm* — Oblon, McClelland, Maier & Neustadt, L.L.P.

(57) ABSTRACT

According to one embodiment, an etching solution used for etching of silicon nitride is provided. The etching solution includes phosphoric acid, an acid, silicic acid compound, and water. The phosphoric acid has a first acid dissociation exponent $pK_{a1}$. The acid has an acid dissociation exponent smaller than the first acid dissociation exponent $pK_{a1}$. A mass ratio M1/M2 of mass M1 of the phosphoric acid to mass M2 of the acid having the acid dissociation exponent smaller than the first acid dissociation exponent $pK_{a1}$ is within a range of 0.82 or more and 725 or less.

30 Claims, 12 Drawing Sheets

(51) Int. Cl.
  *H01L 21/67*  (2006.01)
  *H01L 21/306*  (2006.01)
  *C09K 13/08*  (2006.01)

(52) U.S. Cl.
  CPC .. *H01L 21/30604* (2013.01); *H01L 21/67075* (2013.01); *H01L 21/67086* (2013.01)

(56) References Cited

U.S. PATENT DOCUMENTS

| | | | |
|---|---|---|---|
| 2008/0203060 A1* | 8/2008 | Hara | H01L 21/31111 216/99 |
| 2016/0126107 A1* | 5/2016 | Kil | H01L 21/31111 438/268 |
| 2017/0062231 A1 | 3/2017 | Sato et al. | |

FOREIGN PATENT DOCUMENTS

| | | | | |
|---|---|---|---|---|
| JP | 2008-311436 | | 12/2008 | |
| JP | 2008311436 | * | 12/2008 | ........... H01L 21/308 |
| JP | 2009-21538 | | 1/2009 | |
| JP | 2016-29717 A | | 3/2016 | |
| KR | 10-2016-0050536 | | 5/2016 | |
| TW | 200849371 | | 12/2008 | |

OTHER PUBLICATIONS

Written Opinion dated May 29, 2018 in PCT/JP2018/009795 filed Mar. 13, 2018.

J. M. Tour et al., "evans_pKa_Table", [online], Apr. 5, 2011, ACS Nano, [searched on Mar. 10, 2017], internet <URL: http://evans.rc.fas.harvard.edu/pdf/evans_pKa_table.pdf>), 6 pages.

Hiroka Ariga, et al., "Elucidation of Reaction Mechanism for Complex Formation of Silicate and Metal Ions in ESI-MS", Bunseki Kagaku, vol. 64, No. 5, 2015, 32 pages, (with Machine Generated English Translation).

Okuno Tadakazu, et al., "Multivariate Analysis Method", JUSE Press Ltd., 1971, 12 pages, (with Machine Generated English Translation).

B. Flury, et al., "Multivariate Analysis and Its Application", Jun. 1990, 35 pages, (with Machine Generated English Translation).

Shoichi Nakamura, "Illustration of Multivariate Analysis Primer" The Nikkan Kogyo Shimbun, Ltd., Oct. 1979, 32 pages, (with Machine Generated English Translation).

Yizhak Marcus, "Thermodynamics of Solvation of ions, Part 5—Gibbs Free Energy of Hydration at 298.15 K", Journal of the Chemical Society, Faraday Transactions., 1991, vol. 87, 5 pages.

* cited by examiner

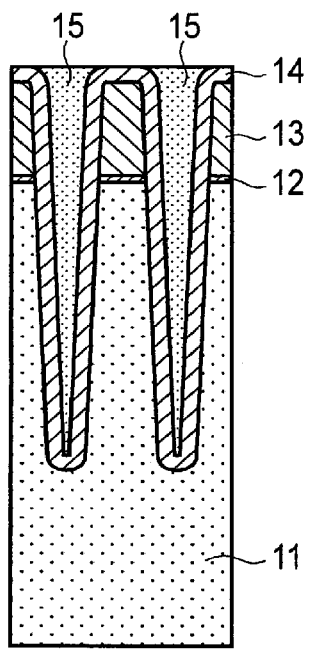
F I G. 2
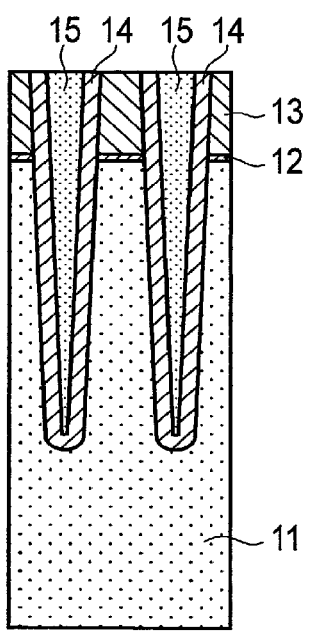
F I G. 3

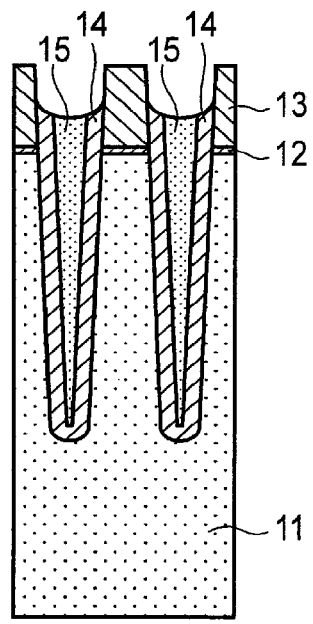
F I G. 4
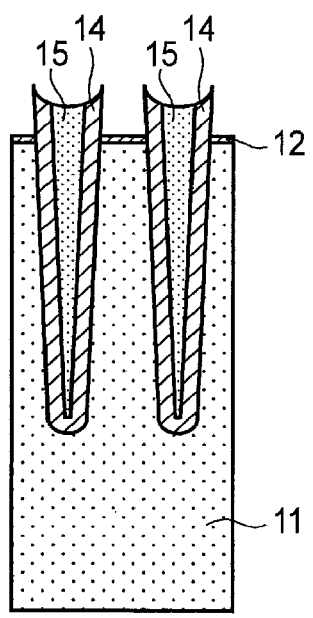
F I G. 5

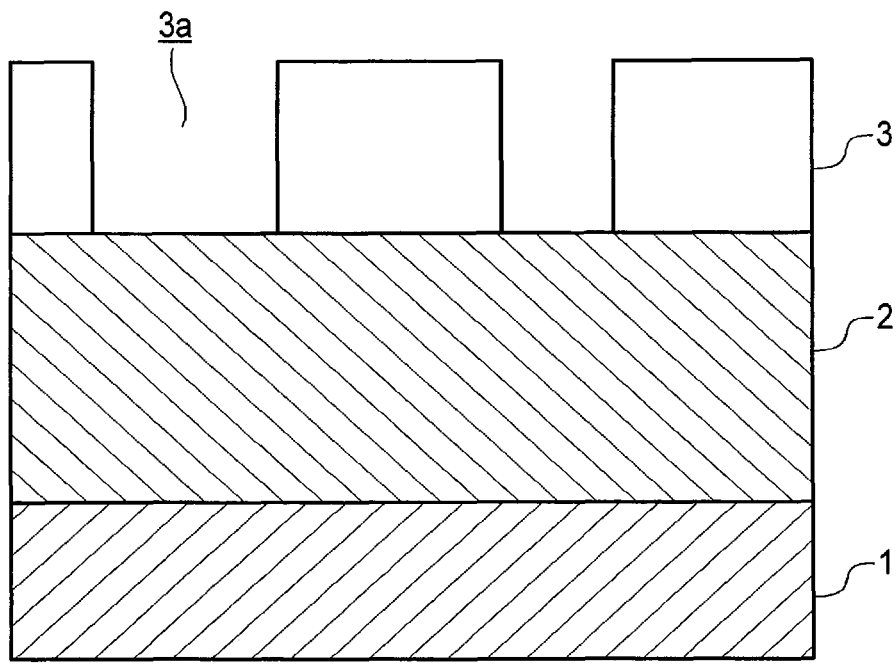
F I G. 8
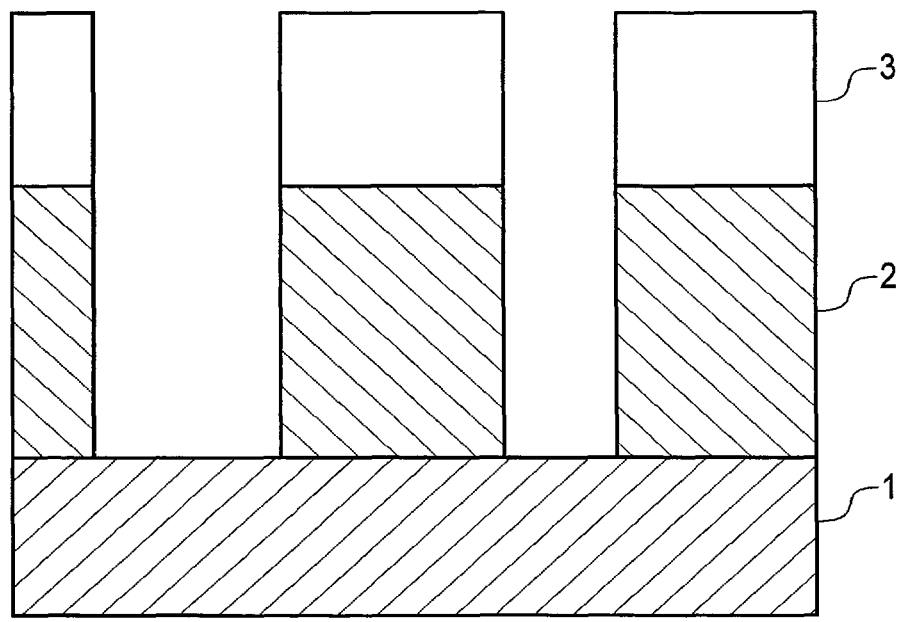
F I G. 9

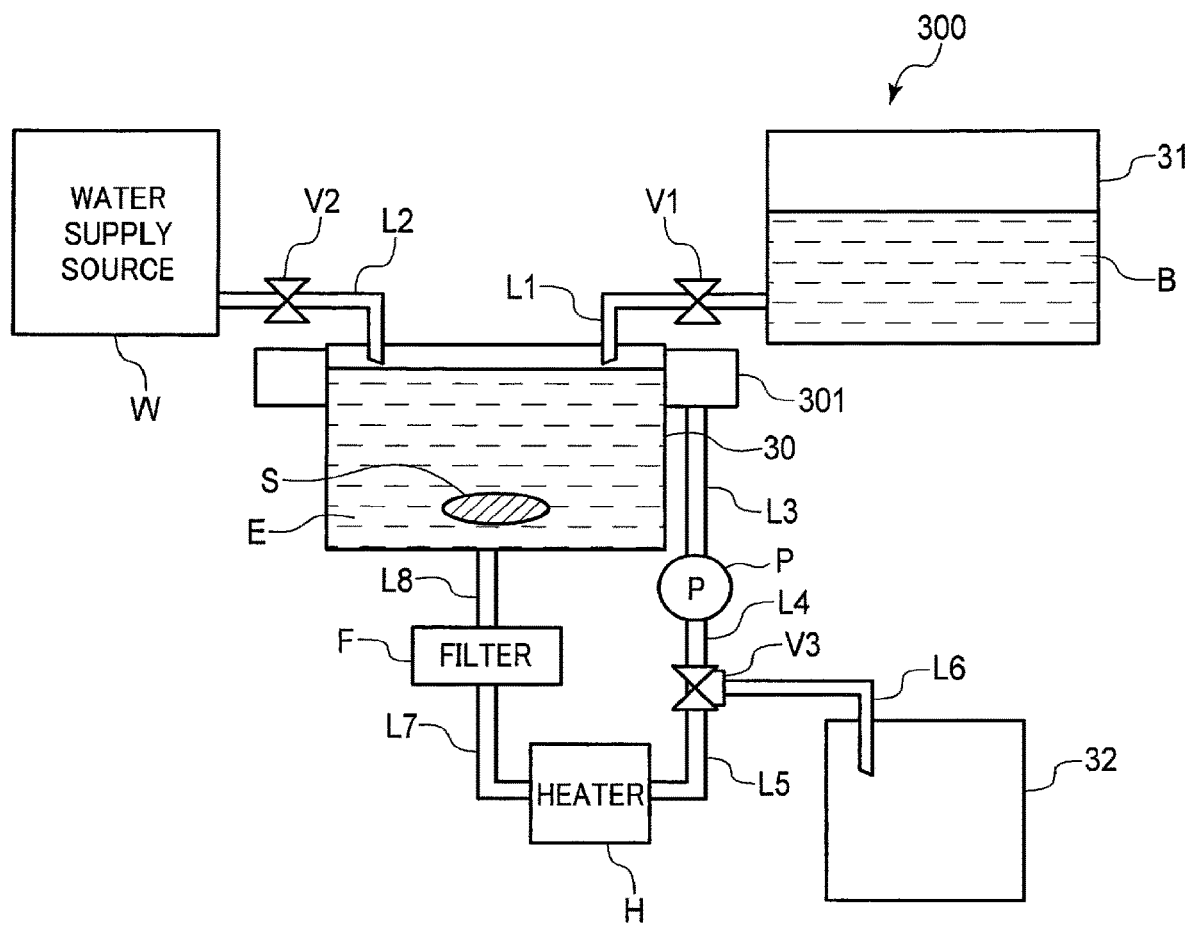
F I G. 14

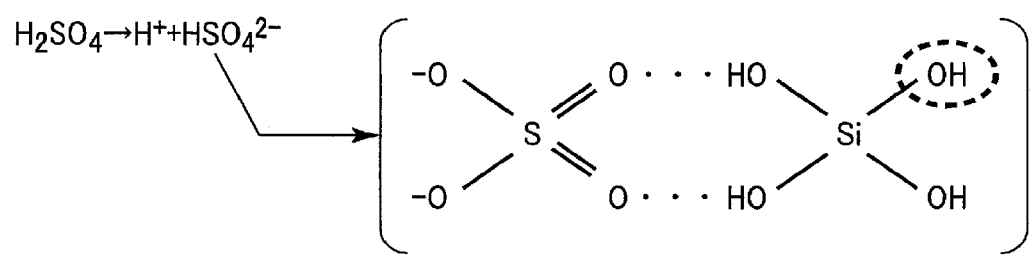
F I G. 17

US 10,957,553 B2

ETCHING SOLUTION, ETCHING METHOD, AND METHOD FOR MANUFACTURING AN ELECTRONIC COMPONENT

CROSS-REFERENCE TO RELATED APPLICATION

This application is a Continuation Application of PCT Application No. PCT/JP2018/009795, filed Mar. 13, 2018, and based upon and claims the benefit of priority from the Japanese Patent Application No. 2017-050306, filed Mar. 15, 2017, the entire contents of which is incorporated herein by reference.

FIELD

Embodiments relate to an etching solution, an etching method, and a method for manufacturing an electronic component.

BACKGROUND

In recent years, in the manufacture of a semiconductor device, a technique for selectively removing silicon nitride from a substrate including silicon oxide ($SiO_2$) and silicon nitride ($Si_3N_4$) is demanded.

As such a technique, wet etching using a phosphoric acid aqueous solution is widely used. In this wet etching, the above-described substrate is immersed in a phosphoric acid aqueous solution warmed to approximately 150° C. for a certain time.

In this wet etching, the increase of the ratio of the etching rate of silicon nitride to the etching rate of silicon oxide, or the selection ratio is demanded. As a method for increasing the selection ratio, wet etching using a mixed solution including sulfuric acid, phosphoric acid, and water is studied.

BRIEF DESCRIPTION OF THE DRAWINGS

FIG. 2 is a cross sectional view schematically illustrating one process of the method for manufacturing the structure to be processed by the etching method according to the second embodiment;

FIG. 3 is a cross sectional view schematically illustrating a process following the process shown in FIG. 2;

FIG. 4 is a cross sectional view schematically illustrating a process following the process shown in FIG. 3;

FIG. 5 is a cross sectional view schematically illustrating a process following the process shown in FIG. 4;

FIG. 8 is a cross sectional view schematically illustrating a process following the process shown in FIG. 7;

FIG. 9 is a cross sectional view schematically illustrating a process following the process shown in FIG. 8;

FIG. 14 is a cross sectional view schematically depicting an example of the etching process apparatus;

FIG. 17 is an illustration describing the function of sulfuric acid as a polymerization inhibitor for silicic acid;

DETAILED DESCRIPTION

Figure 1:
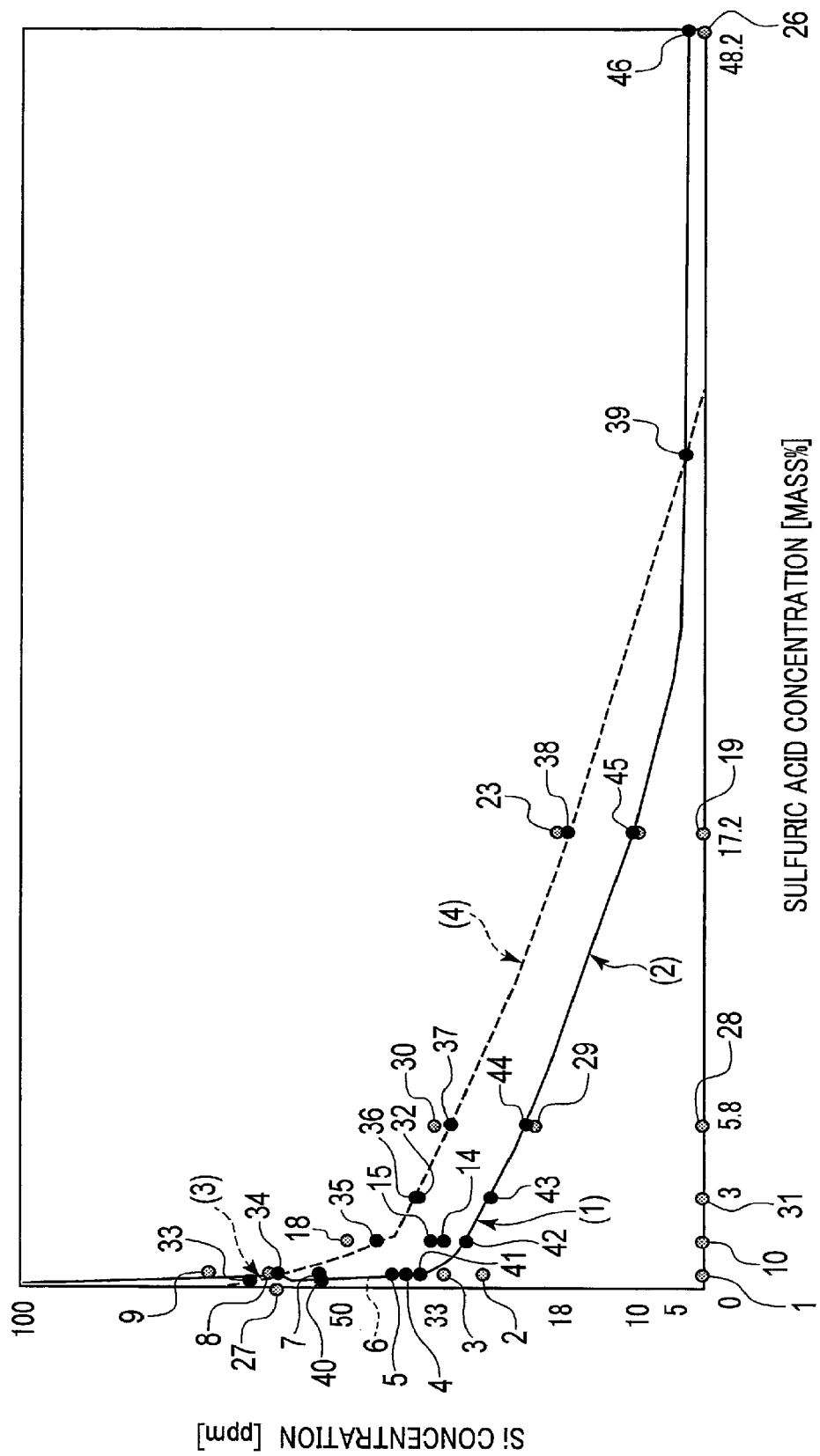
FIG. 1 is a graph illustrating an example of the relationship between the sulfuric acid concentration and the silicon concentration in the etching solution according to the first embodiment.

According to an embodiment, an etching solution used for etching of silicon nitride is provided. The etching solution includes phosphoric acid, an acid, silicic acid compound, and water. The phosphoric acid has a first acid dissociation exponent $pK_{a1}$. The acid has an acid dissociation exponent smaller than the first acid dissociation exponent $pK_{a1}$. A mass ratio M1/M2 of mass M1 of the phosphoric acid to mass M2 of the acid having the acid dissociation exponent smaller than the first acid dissociation exponent $pK_{a1}$ is within a range of 0.82 or more and 725 or less.

According to an embodiment, an etching method is provided. The etching method includes etching of silicon nitride using the etching solution according to the embodiment.

According to an embodiment, a method for manufacturing an electronic component is provided. The method for manufacturing an electronic component includes etching of silicon nitride using the etching solution according to the embodiment.

According to an embodiment, a method for manufacturing an electronic component is provided. The method for manufacturing an electronic component includes: etching a silicon nitride layer from a substrate by the etching method according to the embodiment; and depositing a conductive material on at least a portion of an area from which the silicon nitride layer has been removed. The substrate includes the silicon nitride layer and a silicon oxide layer.

According to an embodiment, an etching solution used for etching of silicon nitride is provided. The etching solution includes: phosphoric acid; an acid; a silicic acid compound; and water. The phosphoric acid has a first acid dissociation exponent $pK_{a1}$. The acid has an acid dissociation exponent smaller than the first acid dissociation exponent $pK_{a1}$. A concentration of the phosphoric acid is 88 mass % or more and 95 mass % or less. A concentration of the acid having the acid dissociation exponent smaller than the first acid dissociation exponent $pK_{a1}$ is 1 mass % or more and 5 mass % or less. A concentration of the water is 4 mass % or more and 11 mass % or less.

According to an embodiment, an etching solution used for etching of silicon nitride is provided. The etching solution includes: phosphoric acid; an acid; hexafluorosilicic acid;

and water. The phosphoric acid has a first acid dissociation exponent $pK_{a1}$. The acid has an acid dissociation exponent smaller than the first acid dissociation exponent $pK_{a1}$.

The problem to be solved by the present invention can be to provide an etching solution that achieves a high selection ratio for silicon nitride, and an etching method and a method for manufacturing an electronic component using the etching solution.

Alternatively, the problem to be solved by the present invention can be to provide an etching solution which allows etching process achieving a good balance among a high etching rate, a high selection ratio for silicon nitride, and suppression of deposition of silicon nitride, and an etching method and an method for manufacturing an electronic component using the etching solution.

The embodiments are described below with reference to drawings.

First Embodiment

The etching solution according to the first embodiment is used for etching of silicon nitride ($Si_3N_4$). In particular, the etching solution is suitable for selectively removing silicon nitride alone from the structure including silicon nitride and silicon oxide.

The etching solution includes phosphoric acid, an acid having an acid dissociation exponent pK smaller than the first acid dissociation exponent $pK_{a1}$ of phosphoric acid, a silicic acid compound, and water.

The acid having an acid dissociation exponent pK smaller than the first acid dissociation exponent $pK_{a1}$ of phosphoric acid works as a selection ratio improver. The selection ratio $ER_{SiN}/ER_{SiO}$ means the ratio of the etching rate of silicon nitride ($ER_{SiN}$) to the etching rate of silicon oxide ($ER_{SiO}$). The first acid dissociation exponent $pK_{a1}$ of phosphoric acid in water at 25° C. is 2.12. The value described in page 1 of Non-Patent Literature 1 (J. M. Tour et al., "evans_pKa_Table", [online], Apr. 5, 2011, ACS Nano, [searched on Mar. 10, 2017], internet <URL: http://evans.rc.fas.harvard.edu/pdf/evans_pKa_table.pdf>) is used as the first acid dissociation exponent $pK_{a1}$ of phosphoric acid.

In the etching solution, the ratio of the mass M1 of phosphoric acid to the mass M2 of the acid having an acid dissociation exponent pK smaller than the first acid dissociation exponent $pK_{a1}$ of phosphoric acid, or the mass ratio M1/M2 is 0.82 or more and 725 or less. When the mass ratio M1/M2 is within this range, the selection ratio for silicon nitride tends to improve.

The silicic acid compound works as a selection ratio improver. More specifically, the etching solution according to the first embodiment includes a silicic acid compound in advance. The use of this etching solution further decreases the etching rate of silicon oxide in comparison with an etching solution free from silicic acid compound in advance. The reason for this is described below.

Phosphoric acid ($H_3PO_4$) can be a main component of the etching solution. Wet etching using a phosphoric acid aqueous solution heated to a temperature of 140° C. to 180° C. is widely used. The wet etching using a phosphoric acid aqueous solution allows selective removal of silicon nitride alone from a structure including silicon oxide and silicon nitride. The mechanism of wet etching using a phosphoric acid aqueous solution at high temperature has not been completely clarified, but the inventors consider the mechanism as follows.

Firstly, silicon nitride ($Si_3N_4$) provided on a substrate is decomposed into a silicic acid compound including silicic acid ($Si(OH)_4$) and ammonium phosphate (($NH_4)_3PO_4$) by water ($H_2O$) and phosphoric acid ($H_3PO_4$) in the etching solution at high temperature. The reaction formula (A) is described below.

$$3Si_3N_4 + 36H_2O + 4H_3PO_4 \rightarrow 3Si(OH)_4 + 4(NH_4)_3PO_4 \tag{A}$$

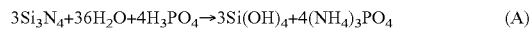

The ammonium phosphate formed by this decomposition can be soluble in the etching solution. Additionally, a part of the silicic acid compound forms silicon oxide ($SiO_2$) by dehydration reaction. This reaction is reversible reaction. The equilibrium reaction formula (B) is described below.

$$3Si(OH)_4 \Leftrightarrow 6H_2O + 3SiO_2 \tag{B}$$

Subsequently, a portion of silicon oxide provided on a substrate reacts with hydroxide ions ($OH^-$) and protons at high temperature, and forms a silicic acid compound including silicic acid ($Si(OH)_4$). These hydroxide ions are formed by ionization of water included in phosphoric acid. This reaction is reversible reaction. The equilibrium reaction formula (C) is described below.

$$SiO_2 + 2OH^- + 2H^+ \Leftrightarrow Si(OH)_4 \tag{C}$$

When the silicon oxide provided on a substrate is etched, equilibrium of the reaction formula (C) shifts toward the right direction, and the concentration of the silicic acid compound increases in the etching solution. As a result of this, equilibrium of the reaction formula (B) shifts toward the right direction, the concentration of the silicic acid compound in the etching solution decreases, and the silicon oxide concentration tends to increase.

The etching solution according to the first embodiment originally includes a silicic acid compound. In this etching solution originally including a silicic acid compound, equilibrium of the reaction formula (B) tends to shift to right before etching of silicon oxide provided on a substrate, or from the initiation of etching. Accordingly, the use of the etching solution according to the first embodiment likely allows more selective removal of silicon nitride from a structure including silicon oxide and silicon nitride in comparison with the case where a phosphoric acid aqueous solution free from silicic acid compound is used.

In the next place, the etching solution according to the first embodiment is specifically described below.

The proportion of phosphoric acid in the etching solution is preferably within the range of 60 mass % or more and 95 mass % or less. When the proportion of phosphoric acid is within this range, the etching rate of silicon nitride tends to increase, and the etching rate of silicon oxide tends to decrease. The proportion of phosphoric acid in the etching solution is more preferably within the range of 70 mass % or more and 85 mass % or less.

The acid having an acid dissociation exponent pK smaller than the first acid dissociation exponent $pK_{a1}$ of phosphoric acid works, as described above, as a selection ratio improver. More specifically, this acid can produce protons in the phosphoric acid aqueous solution. These protons react with at least a portion of hydroxide ions in the etching solution to form water. As a result of this, the concentration of hydroxide ions in the etching solution decreases, and equilibrium of the equilibrium reaction of the formula (C) shifts to left. Accordingly, the concentration of silicic acid decreases, and the silicon oxide concentration increases. Therefore, such acid further decreases the etching rate of silicon oxide.

Examples of the acid include the acids having an acid dissociation exponent pK of less than 2.12, preferably 1.8 or less. The lower limit of the acid dissociation exponent pK is not particularly defined, and, for example, −15 or more.

Examples of the acid include sulfuric acid, hydrochloric acid, nitric acid, trifluorosulfonic acid, and mixtures thereof. In water at 25° C., the first acid dissociation exponent $pK_{a1}$ of sulfuric acid is −3.0, the second acid dissociation exponent $pK_{a2}$ of sulfuric acid is 1.99, the acid dissociation exponent pK of hydrochloric acid is −8, the acid dissociation exponent pK of nitric acid is −1.3, and the acid dissociation exponent pK of trifluorosulfonic acid is −15. These acid dissociation exponents are the values described in page 1 of Non-Patent Literature 1 (J. M. Tour et al., "evans_pKa_Table", [online], Apr. 5, 2011, ACS Nano, [searched on Mar. 10, 2017], internet <URL: http://evans.rc.fas.harvard.edu/pdf/evans_pKa_table.pdf>).

The acid is particularly preferably sulfuric acid. The reason is described below. Firstly, sulfuric acid is a dibasic acid which separates two protons by two-step ionization in an etching solution. As represented by the following reaction formula (D), sulfuric acid is almost completely dissociated into proton and hydrogen sulfate ion in the first stage ionization. A portion of hydrosulfate ions is ionized into protons and sulfate ions as represented by the following reaction formula (E).

    (D)

    (E)

In this manner, sulfuric acid provides two protons, and thus likely more decreases the etching rate of silicon oxide than an acid providing one proton.

In the etching solution, the mass M1 of phosphoric acid and the mass M2 of the acid having an acid dissociation exponent pK smaller than the first acid dissociation exponent $pK_{a1}$ of phosphoric acid, or the mass ratio M1/M2 is preferably within the range of 0.9 or more and 725 or less, and even more preferably within the range of 4.07 or more and 725 or less.

The concentration of the acid having an acid dissociation exponent pK smaller than the first acid dissociation exponent $pK_{a1}$ of phosphoric acid in the etching solution is preferably within the range of 0.1 mass % or more and 48.3 mass % or less.

More specifically, if the amount of the acid having an acid dissociation exponent pK smaller than the first acid dissociation exponent $pK_{a1}$ of phosphoric acid included in the etching solution is too much, deposited acid may adhere to the object to be processed. This may requires removing of the adhered acid after wet etching by washing the object to be processed using water or the like. Accordingly, if wet etching is carried out using the etching solution having a high concentration of the acid, the production efficiency may decrease. On the other hand, when the etching solution including the acid in an amount within the above-described range is used, both a high selection ratio and suppression of acid deposition are achieved, whereby the production efficiency is increased.

The concentration of the acid having an acid dissociation exponent pK smaller than the first acid dissociation exponent $pK_{a1}$ of phosphoric acid in the etching solution is more preferably within the range of 0.1 mass % or more and 28.33 mass % or less, and even more preferably within the range of 0.1 mass % or more and 17.2 mass % or less.

The silicic acid compound typically includes silicic acid $(Si(OH)_4)$. The silicic acid compound may be a monomer or a multimer including a structure as the module represented by the following general formula (I). The number of the module included in a multimer of the silicic acid compound is, for example, 2 or more and 5 or less. The silicic acid compound in the etching solution may be in the form of an ion.

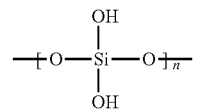

[General Formula (I)]

Specific examples of the monomer or multimer of the silicic acid compound include the monomers to pentamers described in Non-Patent Literature 2 ("Elucidation of Reaction Mechanism for Complex Formation of Silicate and Metal Ions in ESI-MS" written by Hiroka ARIGA and Miho TANAKA, BUNSEKI KAGAKU, 2015, vol. 64, No. 5, p. 349-358).

More specifically, examples of the monomer of the silicic acid compound include $[Si(OH)_3O]H$, $[Si(OH)_3O(H_2O)]H$, $[Si(OH)_3O(H_2O)_2]H$, and mixtures thereof.

Examples of the dimer of the silicic acid compound include $[Si_2 (OH)O_4]H$, $[Si_2 (OH)_3O_3]H$, $[Si_2 (OH)_5O_2]H$, $[Si_2(OH)_5O_2(H_2O)]H$, $[Si_2 (OH)_5O_2(H_2O)_2]H$, and mixtures thereof.

Examples of the trimer of the silicic acid compound include $[Si_3 (OH)_3O_5]H$, $[Si_3 (OH)_5O_4]H$, $[Si_3 (OH)_7O_3]H$, $[Si_3 (OH)_5O_4(H_2O)]H$, $[Si_3 (OH)_7O_3(H_2O)_2]H$, and mixtures thereof.

Examples of the tetramer of the silicic acid compound include $[Si_4 (OH)_3O_7]H$, $[Si_4 (OH)_5O]H$, $[Si_4 (OH)_7O_5]H$, $[Si_4(OH)_5O_6(H_2O)]H$, and mixtures thereof.

Examples of the pentamer of the silicic acid compound include $[Si_5 (OH)_7O_7]H$.

The silicic acid compound can be introduced into the etching solution by, for example, dissolving a silicic acid compound source into an aqueous solution including sulfuric acid and phosphoric acid. Examples of the silicic acid compound source include silicon nitride, silica, and mixtures thereof.

The amount of the silicic acid compound included in the etching solution can be grasped by measuring the silicon (Si) concentration in the etching solution. The silicon concentration can be measured by, for example, using a high frequency inductive coupling plasma emission analysis device (ICP-AES).

The silicon concentration in the etching solution is preferably 5 ppm or more, more preferably 10 ppm or more, and even more preferably 20 ppm or more. When a sufficient amount of silicon is included in the etching solution, the selection ratio tends to be high. The silicon concentration (ppm) means the amount of silicon (mg) included in 1 kg of the etching solution.

The silicon concentration in the etching solution is preferably 98 ppm or less, more preferably 73 ppm or less, and even more preferably 50 ppm or less. If the amount of silicon included in the etching solution is small, deposition of silicon oxide becomes hard to occur.

Deposition of silicon oxide means a phenomenon wherein the polymer formed by polymerization of silicic acid included in the etching solution adheres to the surface of a workpiece. The deposition of silicon oxide is described below in detail.

The silicon concentration in the etching solution and the concentration of the acid having an acid dissociation exponent pK smaller than the first acid dissociation exponent $pK_{a1}$ of phosphoric acid preferably satisfy the relationship given at least one of the following formulae (1) to (4).

FIG. 1 is a graph illustrating an example of the relationship between the sulfuric acid concentration and the silicon concentration in the etching solution according to the first embodiment. In this graph, the abscissa represents the sulfuric acid concentration in the etching solution, and the ordinate represents the silicon concentration in the etching solution.

In this graph, the lower line represented by a full line indicates the lower limit of the silicon concentration at each the sulfuric acid concentration. On this lower line, the silicon concentration Y1 when the sulfuric acid concentration is 0.11 mass % or more and 2.9 mass % or less is represented by the following formula (1). The formula (1) is obtained by multivariate analysis on the results of the experiment carried out by the inventors. Details about the multivariate analysis are described below. In the following formula (1), X represents the reciprocal of the value of the sulfuric acid concentration.

$$Y1 = 21.876 \times e^{0.1712x} \quad \text{Formula (1)}$$

On the lower line, the silicon concentration Y2 when the sulfuric acid concentration is more than 2.9 mass % and 28.33 mass % or less is represented by the following formula (2), and 5 or more. The formula (2) is obtained by multivariate analysis on the results of the experiment carried out by the inventors. In the following formula (2), X represents the reciprocal of the value of the sulfuric acid concentration.

$$Y2 = 6.6356 \times \log_e(X) + 29.083 \quad \text{Formula (2)}$$

On the lower line, the silicon concentration when the sulfuric acid concentration is more than 28.33 mass % and 48.3 mass % or less is represented by a straight line of Y=5.

In the etching solution wherein the concentration of the acid having an acid dissociation exponent pK smaller than the first acid dissociation exponent $pK_{a1}$ of phosphoric acid is 0.29 mass % or more and 2.9 mass % or less, a higher selection ratio $ER_{SiN}/ER_{SiO}$ can be achieved by making the silicon concentration Y1 ppm or more.

Furthermore, in the etching solution wherein the concentration of the acid having an acid dissociation exponent pK smaller than the first acid dissociation exponent $pK_{a1}$ of phosphoric acid is more than 2.9 mass % and 28.33 mass % or less, a higher selection ratio $ER_{SiN}/ER_{SiO}$ can be achieved by making the silicon concentration Y2 ppm or more.

Furthermore, in the etching solution wherein the concentration of the acid having an acid dissociation exponent pK smaller than the first acid dissociation exponent $pK_{a1}$ of phosphoric acid is more than 28.33 mass % and 48.3 mass % or less, a higher selection ratio $ER_{SiN}/ER_{SiO}$ can be achieved by adjusting the silicon concentration to 5 ppm or more.

More specifically, a high selection ratio $ER_{SiN}/ER_{SiO}$ can be achieved by adjusting the silicon concentration in the etching solution to Y1 ppm or more when the concentration of the acid having an acid dissociation exponent pK smaller than the first acid dissociation exponent $pK_{a1}$ of phosphoric acid is 0.11 mass % or more and 2.9 mass % or less, Y2 ppm or more when the acid concentration is more than 2.9 mass % and 28.33 mass % or less, and 5 ppm or more when the acid concentration is more than 28.33 mass % and 48.3 mass % or less.

Additionally, in this graph, the upper line represented by a broken line indicates the upper limit of the silicon concentration at each the sulfuric acid concentration. On the upper line, the silicon concentration Y3 in the range of the sulfuric acid concentration of 0.11 mass % or more and 0.58 mass % or less is represented by the following formula (3). The formula (3) is obtained by multivariate analysis on the results of the experiment carried out by the inventors. In the following formula (3), X represents the reciprocal of the value of the sulfuric acid concentration.

$$Y3 = 18.958 \times \log_e(X) + 53.583 \quad \text{Formula (3)}$$

On the upper line, the silicon concentration Y3 when the sulfuric acid concentration is more than 0.58 mass % and 28.33 mass % or less is represented by the following formula (4). The formula (4) is obtained by multivariate analysis on the results of the experiment carried out by the inventors. In the following formula (4), X represents the reciprocal of the value of the sulfuric acid concentration.

$$Y4 = 18.111 \times \log_e(X) + 65.953 \quad \text{Formula (4)}$$

In the etching solution wherein the concentration of the acid having an acid dissociation exponent pK smaller than the first acid dissociation exponent $pK_{a1}$ of phosphoric acid is within the range of 0.11 mass % or more and 5.78 mass % or less, deposition of silicon oxide can be sufficiently suppressed by making the silicon concentration Y3 ppm.

Additionally, in the etching solution wherein the concentration of the acid having an acid dissociation exponent pK smaller than the first acid dissociation exponent $pK_{a1}$ of phosphoric acid is within the range of more than 5.78 mass % and 28.33 mass % or less, deposition of silicon oxide can be sufficiently suppressed by making the silicon concentration Y4 ppm.

More specifically, deposition of silicon oxide can be sufficiently suppressed by adjusting the silicon concentration in the etching solution to 5 ppm or more and Y3 ppm or less when the concentration of the acid having an acid dissociation exponent pK smaller than the first acid dissociation exponent $pK_{a1}$ of phosphoric acid is within the range of 0.11 mass % or more and 0.58 mass % or less, and 5 ppm or more and Y4 ppm or less when the acid concentration is more than 0.58 mass % and 28.33 mass % or less.

From the above description, in the etching solution wherein the concentration of the acid having an acid dissociation exponent pK smaller than the first acid dissociation exponent $pK_{a1}$ of phosphoric acid is within the range of 0.11 mass % or more and 0.58 mass % or less, a high selection ratio $ER_{SiN}/ER_{SiO}$ and suppression of deposition of silicon oxide can be achieved by making the silicon concentration Y1 ppm or more and Y3 ppm or less.

Additionally, in the etching solution wherein the concentration of the acid having an acid dissociation exponent pK smaller than the first acid dissociation exponent $pK_{a1}$ of phosphoric acid is within the range of more than 0.58 mass % and 2.9 mass % or less, a high selection ratio $ER_{SiN}/ER_{SiO}$ and suppression of deposition of silicon oxide can be achieved by adjusting the silicon concentration to Y1 ppm or more and Y4 ppm or less.

Additionally, in the etching solution wherein the concentration of the acid having an acid dissociation exponent pK smaller than the first acid dissociation exponent $pK_{a1}$ of phosphoric acid is within the range of more than 2.9 mass % and 28.33 mass % or less, a high selection ratio $ER_{SiN}/ER_{SiO}$ and suppression of deposition of silicon oxide can be achieved by adjusting the silicon concentration to Y2 ppm or more and Y4 ppm or less.

More specifically, a high selection ratio $ER_{SiN}/ER_{SiO}$ and suppression of deposition of silicon oxide can be achieved by adjusting the silicon concentration in the etching solution to within the range of Y1 ppm or more and Y3 ppm or less when the concentration of the acid having an acid dissociation exponent pK smaller than the first acid dissociation exponent $pK_a t$ of phosphoric acid is within the range of 0.11 mass % or more and 0.58 mass % or less, Y1 ppm or more and Y4 ppm or less when the acid concentration is more than 0.58 mass % and 2.9 mass % or less, and Y2 ppm or more and Y4 ppm or less when the acid concentration is more than 2.9 mass % and 28.33 mass % or less.

Details about the multivariate analysis are described below.

Clarification of a phenomenon is carried out using data, the data represents the phenomenon and properties, and they represent the results of mutual influence of related properties. The data includes effective information, and effective retrieval of the information and summarization into a general result are necessary. When many properties are related, the analysis is referred to as multivariate analysis, and the data is referred to as multivariate data. Multivariate analysis is a part of statistics, a mathematical model, and summarizes the data based on hypothesis and assumption. Extraction of the factors used therein must be carried out objectively based on the mechanism of the phenomenon. The conclusion of the analysis is also based on the combination of the data embodying the factors, so that the properties of the data and the measurement manner are important points. Examination of whether the data satisfies the assumption and hypothesis premised by the method is an essential factor for carrying out multivariate analysis.

Multivariate analysis analyzes the relationship among many variables included in one population. The direction of purpose is not identical, so that its method is not one settled method. When variables $x_1$ are bonded and assigned to an external variable Y, it is formally represented by the following formula (3.18).

[Formula 1]

$$Y = b_0 x_0 + b_1 x_1 + b_2 x_2 + \ldots b_n x_n \quad (3.18)$$

Based on the properties of the variables in the formula and the purpose of the formula, the formula (3.18) is classified into multiple regression analysis, principle component analysis, canonical correlation analysis, factor analysis, and discriminant function.

The statistical analysis software (manufactured by JMP-SAS Institute Inc.) used herein is based on multiple regression analysis. Multiple regression analysis is represented by the above-described formula (3.18), and $x_i$ are respectively independent.

Non-Patent Literatures 3 to 5 are listed as references of multivariate analysis.
[Non Patent Literature 3] Tadakazu Okuno, Hitoshi Kume, Toshiro Haga, and Tadashi Yoshizawa, "Multivariate Analysis Method" JUSE Press Ltd., 1971, p. 1-6
[Non Patent Literature 4] B. Flury and H. Riedwyl, "Multivariate Analysis and Its Application", translated by Yoshio Tabata, Gendai Sugakusha, June 1990, p. 57-80
[Non Patent Literature 5] Shoichi Nakamura, "Illustration of Multivariate Analysis Primer" The Nikkan Kogyo Shimbun, Ltd., October 1979, p. 1-21

Water works as an etchant for silicon nitride as represented by the reaction formula (A). The concentration of water in the etching solution is preferably 4 mass % or more, and more preferably 10 mass % or more. When the concentration of water is high, the selection ratio for silicon nitride tends to improve.

The boiling point of water is lower than the boiling points of phosphoric acid and sulfuric acid. Accordingly, if the proportion of water in the etching solution is excessively increased, the boiling point of the etching solution decreases, and the etching solution may boil. Accordingly, from the viewpoint of preventing boiling of the etching solution, the concentration of water in the etching solution is preferably 17 mass % or less, more preferably 15 mass % or less, even more preferably 12 mass % or less, and yet even more preferably 5 mass % or less.

As described above, adjustment of the silicon concentration in the etching solution according to the concentration of the acid having an acid dissociation exponent pK smaller than the first acid dissociation exponent $pK_{a1}$ of phosphoric acid in the etching solution achieves a further marked etching solution. Furthermore, the inventors have found that an even more marked etching solution can be achieved by adjusting the silicon concentration in the etching solution according to the water concentration in the etching solution. More specifically, when the concentration of the acid having an acid dissociation exponent pK smaller than the first acid dissociation exponent $pK_{a1}$ of phosphoric acid is same, a high selection ratio can be achieved by decreasing the water concentration and increasing the concentration of the silicic acid compound.

For example, when the concentration of the acid having an acid dissociation exponent pK smaller than the first acid dissociation exponent $pK_{a1}$ of phosphoric acid in the etching solution is 2 mass % or less and the water concentration is 5 mass % or less, the silicon concentration is preferably 45 ppm or more, more preferably 55 ppm or more, and even more preferably 90 ppm or more.

Additionally, when the concentration of the acid having an acid dissociation exponent pK smaller than the first acid dissociation exponent $pK_{a1}$ of phosphoric acid in the etching solution is 2 mass % or less and the water concentration is 5 mass % or less, the silicon concentration is preferably 129 ppm or less, and more preferably 115 ppm or less. If the amount of silicon included in the etching solution is small, deposition of silicon oxide hardly occurs.

The etching solution according to the first embodiment may include phosphoric acid, an acid having an acid dissociation exponent pK smaller than the first acid dissociation exponent $pK_{a1}$ of phosphoric acid, a silicic acid compound, and water, besides, a salt including a monovalent cation having a hydration number of 3.5 or less.

This salt works as an inhibitor of deposition of silicon oxide. More specifically, this salt forms a monovalent cation $A^+$ having a hydration number of 3.5 or less in the etching solution. The monovalent cation $A^+$ can substitute hydrogen of silanol group (Si—O—H) in silicic acid $Si(OH)_4$ to form $(OH)_3$—Si—O—$A^+$. The $(OH)_3$—Si—O—$A^+$ is hardly polymerized in comparison with silicic acid $Si(OH)_4$. Accordingly, when the etching solution further includes this salt, formation of a polymer by polymerization of silicic acid in the etching solution can be suppressed.

The monovalent cation $A^+$ having a hydration number of 3.5 or less has fewer water molecules to be coordinated in the etching solution. Additionally, as described above, water included in the etching solution is an etchant for silicon nitride. Accordingly, the etching solution including the monovalent cation $A^+$ having a hydration number of 3.5 or less tends to have a higher water concentration working as an etchant in the etching solution in comparison with an etching solution including a monovalent cation having a hydration number of more than 3.5.

Deposition of silicon oxide (Si—O—Si) is equilibrium reaction accompanied by formation of water as represented by the following reaction formula (G).

Si—OH+HO—Si⇌Si—O—Si+H₂O        (G)

Accordingly, addition of a salt forming a cation to an etching solution increases the concentration of hydrated cation in the etching solution, and the decrease of water working as an etchant shifts equilibrium of the reaction formula (G) to right, whereby the silicon oxide concentration tends to be high. Accordingly, when a salt including a monovalent cation $A^+$ having a hydration number of 3.5 or less is added to the etching solution, deposition of silicon oxide is more suppressed in comparison with the case wherein a salt including a cation having a hydration number of more than 3.5 is added to an etching solution.

Examples of the monovalent cation $A^+$ having a hydration number of 3.5 or less include sodium ion ($Na^+$), silver ion ($Ag^+$), potassium ion ($K^+$), ammonium ion ($NH_4^+$), rubidium ion ($Rb^+$), titanium ion ($Ti^+$), and cesium ion ($Cs^+$). The monovalent cation $A^+$ having a hydration number of 3.5 or less may include two or more of these ions.

The hydration number of $Na^+$ is 3.5, the hydration number of $Ag^+$ is 3.1, the hydration number of $K^+$ is 2.6, the hydration number of $NH_{4+}$ is 2.4, the hydration number of $Rb^+$ is 2.4, the hydration number of $Ti^+$ is 2.4, and the hydration number of $Cs^+$ is 2.1. These hydration numbers are values described in Non-Patent Literature 6 (Yizhak Marcus, "Thermodynamics of Solvation of ions, Part 5—Gibbs Free Energy of Hydration at 298.15 K" JOURNAL OF THE CHEMICAL SOCIETY, FARADAY TRANSACTIONS., 1991, VOL. 87).

The salt including the monovalent cation $A^+$ having a hydration number of 3.5 or less is preferably at least one salt selected from the group consisting of sodium chloride (NaCl), potassium chloride (KCl), sodium sulfate ($Na_2SO_4$), and potassium sulfate ($K_2SO_4$).

The salt concentration in the etching solution is preferably within the range of 0.05 mol/L or more and 2 mol/L or less. When the salt concentration is within this range, suppression of deposition of silicon oxide and a high selection ratio tend to be achieved.

The etching solution according to the first embodiment includes, as described above, phosphoric acid, an acid having an acid dissociation exponent smaller than the first acid dissociation exponent $pK_{a1}$ of phosphoric acid, a silicic acid compound, and water. In the etching solution according to the first embodiment, the ratio of the phosphoric acid mass M1 to the acid mass M2, or mass ratio M1/M2 is within the range of 0.82 or more and 725 or less. When wet etching using this etching solution is carried out on a structure including silicon nitride, a high selection ratio is sufficiently achieved, this allows selective removal of silicon nitride.

Second Embodiment

The etching method according to the second embodiment includes etching of silicon nitride using the etching solution according to the first embodiment. Details about the etching method according to the second embodiment are described below.

Firstly, the substrate to be processed by the etching method according to the second embodiment is described with reference to FIG. 2 to FIG. 5. FIG. 2 is a cross sectional view schematically illustrating one process of the method for manufacturing the structure to be processed by the etching method according to the second embodiment. An example of the method for manufacturing a substrate using the STI (Shallow Trench Isolation) technique is described herein.

The structure illustrated in FIG. 2 includes a silicon layer 11, an insulating film 12, a mask 13, a high temperature oxide film 14, and a coating type oxide film 15. The structure illustrated in FIG. 2 can be obtained by, for example, the following method. Firstly, silicon oxide is deposited on the silicon layer 11 by, for example, chemical vapor deposition (CVD), thereby forming the insulating film 12. The silicon layer 11 is made of, for example, single crystal silicon. Subsequently, silicon nitride is deposited on the insulating film 12 by the CVD method, thereby forming the mask 13. In this manner, a laminate including the silicon layer 11, the insulating film 12, and the mask 13 is obtained. Subsequently, a shallow trench is formed on a part of the laminate by the reactive ion etching (RIE) method. Subsequently, the surface of the laminate is oxidized at a high temperature, whereby the high temperature oxide film 14 is formed on the part of the laminate having the shallow trench. The high temperature oxide film 14 is typically made of silicon oxide. The high temperature oxide film 14 may be omitted. Subsequently, a silica-based film-forming coating solution is applied to the high temperature oxide film 14, thereby filling the shallow trench with the silica-based film-forming coating solution. Subsequently, the silica-based film-forming coating solution is oxidized, thereby forming the coating type oxide film 15. The coating type oxide film 15 is typically made of silicon oxide. In this manner, the structure illustrated in FIG. 2 is obtained.

In the next place, as illustrated in FIG. 3, the surface of the laminate is flattened by the chemical-mechanical polishing (CMP) method. At this time, the mask 13 works as a stopper film.

In the next place, as illustrated in FIG. 4, the top surfaces of the high temperature oxide film 14 and the coating type oxide film 15 are removed by the RIE method.

In this manner, the structure to be processed by the etching method according to the second embodiment is obtained.

In the next place, the structure is immersed in the etching solution according to the first embodiment, and the mask 13 is selectively etched from this structure. The temperature of the etching solution may be approximately 160° C. In this manner, the structure illustrated in FIG. 5 is obtained.

Figure 6:
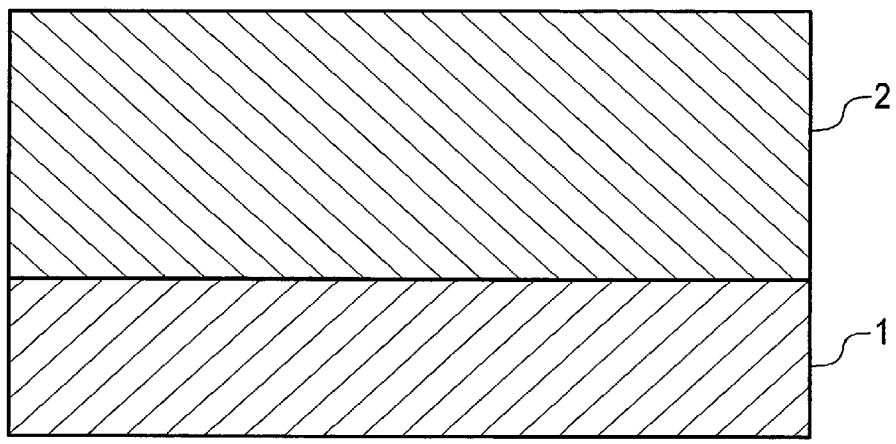
FIG. 6 is a cross sectional view schematically illustrating one process of the method for manufacturing a substrate to be processed by the etching method according to the second embodiment.

The structure illustrated in FIG. 4 is used as an example of the structure to be processed by the etching method according to the second embodiment, but the structure other than that illustrated in FIG. 4 may be used. The method for manufacturing a substrate to be processed by the etching method according to the second embodiment is described below with reference to FIG. 6 to FIG. 11. FIG. 6 is a cross sectional view schematically illustrating one process of the method for manufacturing a substrate to be processed by the etching method according to the second embodiment. The structure illustrated in FIG. 6 includes a substrate 1 and a silicon oxide film 2.

The substrate 1 is, for example, a semiconductor substrate. Examples of the semiconductor substrate include substrates including mainly inorganic substances, such as silicon substrate (Si substrate), gallium nitride substrate (GaN substrate), and silicon carbide substrate (SiC substrate).

The silicon oxide film 2 is provided on at least one main surface of the substrate 1. The silicon oxide film 2 is formed by, for example, the sputtering method or chemical vapor deposition (CVD) method. The material of the film provided on the substrate 1 may be a material other than silicon oxide.

Figure 7:
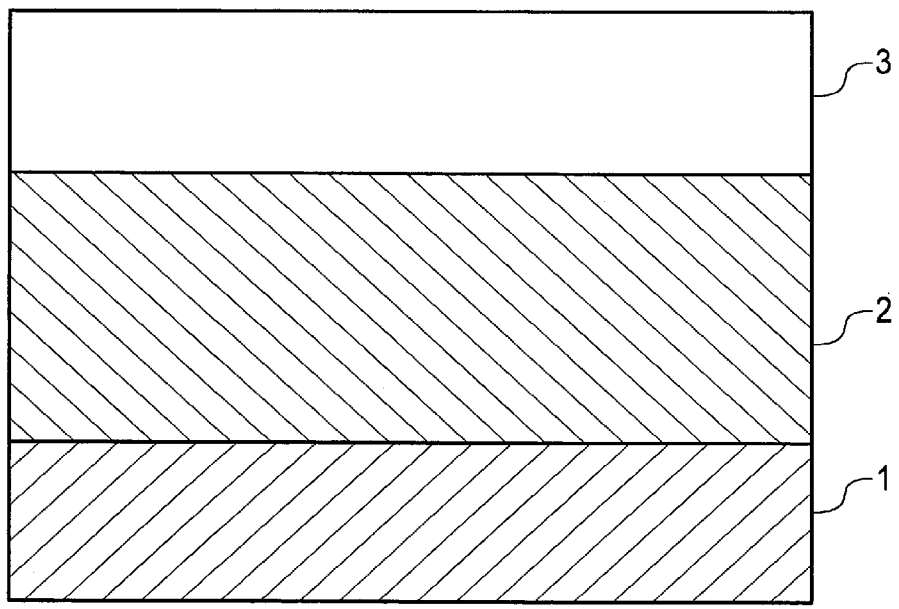
FIG. 7 is a cross sectional view schematically illustrating a process following the process shown in FIG. 6.

In the next place, as illustrated in FIG. 7, a resist layer 3 is provided on the silicon oxide film 2. The resist layer 3 can be formed by, for example, applying a liquid resist material to the silicon oxide film 2. The resist layer 3 may be formed by dry film resist using, for example, a roll laminator.

In the next place, as illustrated in FIG. 8, a portion of the resist layer 3 is removed by photolithography method, thereby forming an opening 3a.

In the next place, as illustrated in FIG. 9, a pattern is formed on the silicon oxide film 2. Specifically, for example, the area on the silicon oxide film 2 not covered by the resist layer 3 is etched by the dry etching method. As a result of this, the silicon oxide film 2 having a pattern including plural projections is obtained.

Figure 10:
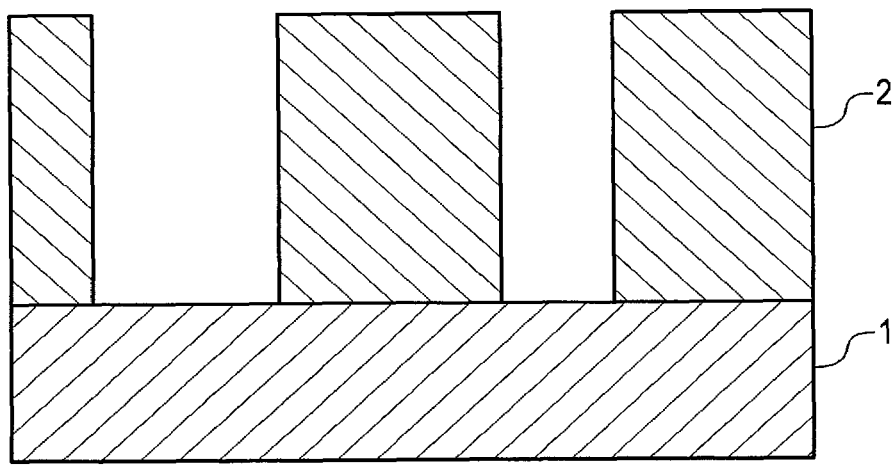
FIG. 10 is a cross sectional view schematically illustrating a process following the process shown in FIG. 9.

In the next place, as illustrated in FIG. 10, the resist layer 3 is peeled from the silicon oxide film 2 using a resist stripping solution such as an alkaline solution.

Figure 11:
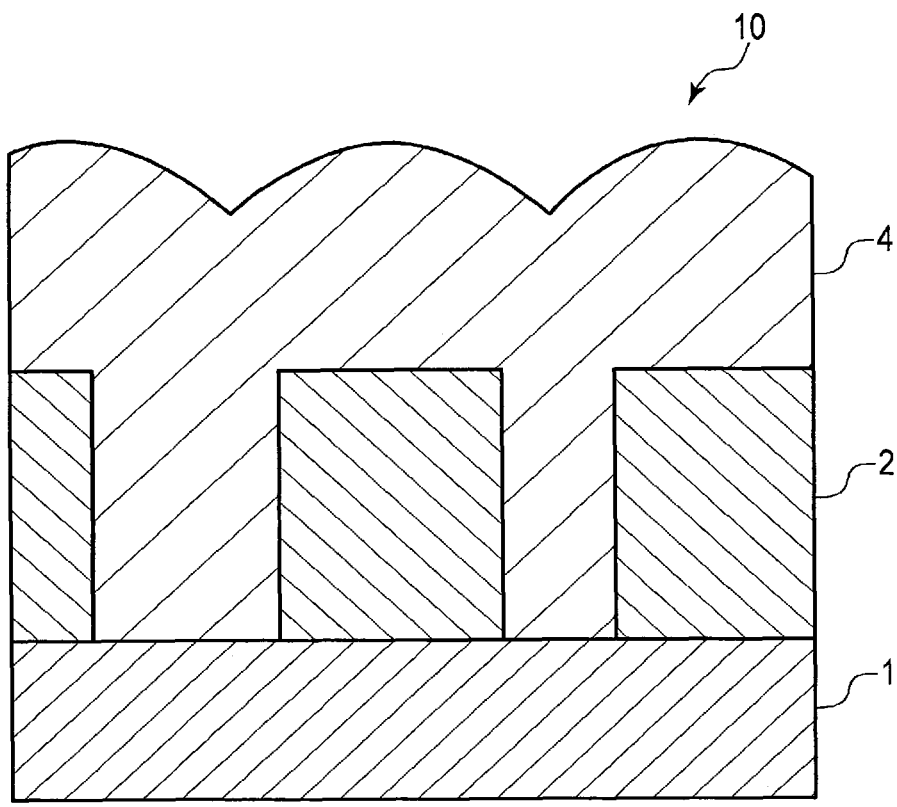
FIG. 11 is a cross sectional view schematically illustrating a process following the process shown in FIG. 10.

In the next place, as illustrated in FIG. 11, a silicon nitride film 4 is formed on the substrate 1 and the silicon oxide film 2. Specifically, for example, silicon nitride is deposited by the sputtering method or the chemical vapor deposition (CVD) method on the silicon oxide film 2 and the main surface of the substrate 1 in the area not covered by the silicon oxide film 2, thereby forming the silicon nitride film 4.

In this manner, a substrate 10 to be processed by the etching method according to the second embodiment is obtained. In the substrate 10 to be processed, at least a portion of the silicon oxide film 2 and the silicon nitride film 4 is alternately arranged in the direction parallel to the main surface of the substrate 1.

In this example, a structure wherein the silicon oxide film 2 and the silicon nitride film 4 are alternately arranged on one main surface of the substrate 1 is described. The structure wherein the silicon oxide film 2 and the silicon nitride film 4 are alternately arranged may be provided on the both surfaces of the substrate 1.

In the next place, the substrate 10 to be processed thus obtained is immersed in the etching solution according to the first embodiment, thereby selectively etching the silicon nitride film 4 from the substrate 10 to be processed.

Figure 12:
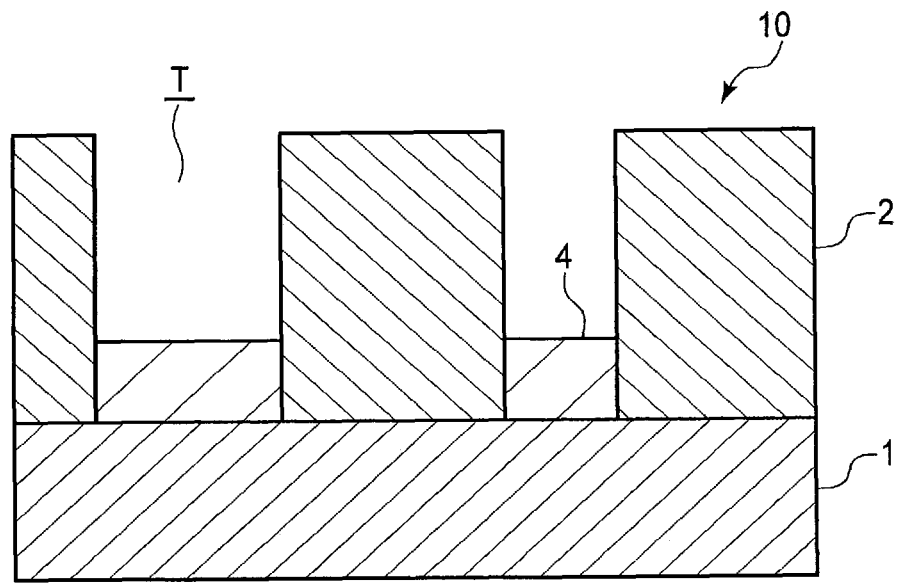
FIG. 12 is a cross sectional view schematically illustrating the state before completion of etching process in the etching method according to the second embodiment.

FIG. 12 is a cross sectional view schematically illustrating the state before completion of etching process in the etching method according to the second embodiment. As illustrated in FIG. 12, when the substrate 10 to be processed is immersed in the etching solution according to the first embodiment, the silicon nitride film 4 dissolves in the etching solution from the surface of the silicon nitride film 4 opposed to the main surface of the substrate 1. More specifically, when this etching process is carried out, the thickness of the silicon nitride film 4 extending vertically to the substrate 1 decreases with the lapse of the process time. When the etching process further proceeds, a trench T is formed between the projections made of a pair of silicon oxide films 2 in the area where the silicon nitride film 4 existed. The depth of the trench T increases with the lapse of the process time. The trench T is filled with the etching solution. Accordingly, with the progress of etching of the silicon nitride film 4, the surface in contact with the etching solution increases in the side surfaces of the patterns of the silicon oxide film 2 exposed by etching of the silicon nitride film 4.

The etching solution according to the first embodiment used in the etching method according to the second embodiment can achieve a high selection ratio. Accordingly, side etching hardly occurs even if side surfaces of projections including the silicon oxide film 2 are exposed to the etching solution for a long time. Therefore, the etching method according to the second embodiment prevents the problem that the side surfaces of the pattern of the silicon oxide film 2 are etched and the desired shape cannot be obtained.

Furthermore, in the etching method according to the second embodiment, when the relationship between the silicon concentration in the etching solution and the concentration of the acid having an acid dissociation exponent pK smaller than the first acid dissociation exponent $pK_{a1}$ of phosphoric acid satisfies at least one of the formula (3) and the formula (4), deposition of silicon oxide is suppressed.

Figure 13:
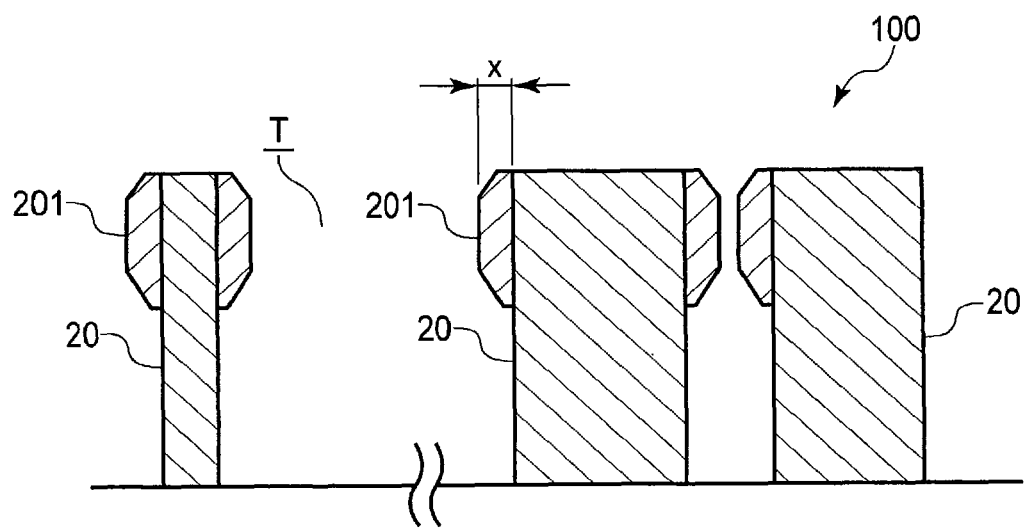
FIG. 13 is a cross sectional view schematically illustrating a substrate after etching process.

Details about deposition of silicon oxide are described below with reference to drawings. FIG. 13 is a cross sectional view schematically illustrating a substrate after etching process. The processed substrate 100 is obtained by performing etching process of the substrate 10 to be processed illustrated in FIG. 11.

In the processed substrate 100 illustrated in FIG. 13, the area where the silicon nitride film 4 has been formed on the substrate 10 to be processed illustrated in FIG. 12 is selectively removed, whereby a pattern having a plurality of projections 20 made of silicon oxide is formed. A trench T illustrated in FIG. 13 is provided between a pair of projections 20 of silicon oxide, which is an area where the silicon nitride film 4 has been formed in the substrate 10 to be processed illustrated in FIG. 12. In the processed substrate 100, a deposit 201 is attached to the side surfaces of the tip of the projections 20 of silicon oxide. The deposit 201 includes a polymer of silicon oxide formed by polymerization of silicic acid included in the etching solution.

Adhesion of a large amount of the deposit 201 to the projections 20 of silicon oxide is not preferred because the desired shape cannot be obtained. Additionally, an excessive amount of the deposit 201 is further not preferred because the top of the trench T is blocked by the deposit 201, and the shape to be obtained will be utterly different from the desired shape.

The deposition amount of the deposit 201 can be converted into a numerical value by, as illustrated in FIG. 13, measuring the thickness X of the side surface of the projections 20 of silicon oxide along the direction parallel to the substrate 1. The thickness X can be determined by observing the processed substrate 100 using, for example, an electron microscope.

The etching method according to the second embodiment can be continuously carried out using an etching process apparatus. FIG. 14 is a cross sectional view schematically depicting an example of the etching process apparatus. The etching process apparatus 300 includes a processing tank 30, a buffer tank 31, a drain tank 32, a water supply source W, a pump P, a heater H, a filter F, pipes L1 to L8, and valves V1 to V3.

The processing tank 30 includes a storage tank 301, and a heater and a stirrer not shown. The processing tank 30 can accommodate the etching solution E according to the first embodiment and the sample S.

The storage tank 301 has a frame shape. The storage tank 301 surrounds the region adjacent to the upper layer of the processing tank 30 and forms a storage part which can store a portion of the etching solution E overflown from the processing tank 30.

The buffer tank 31 can accommodate the buffer solution B. The buffer tank 31 is connected to the processing tank 30 by the pipe L1. The pipe L1 supplies the buffer solution B accommodated in the buffer tank 31 to the processing tank

30. The valve V1 is provided in the pipe L1. The valve V1 includes a pair of inlet and outlet, and is a motorized valve which can switch the state where the inlet and outlet are communicated with each other and the state where they are not communicated under electric control.

The water supply source W is connected to the processing tank 30 by the pipe L2. The pipe L2 supplies water from the water supply source W to the processing tank 30. The valve V2 is provided in the pipe L2. The valve V2 includes a pair of inlet and outlet, and is a motorized valve which can switch the state where the inlet and outlet are communicated with each other and the state where they are not communicated under electric control.

The pipes L3 to L5, L7 and L8, the valve V3, the pump P, the heater H, and the filter F constitute a circulation channel. This circulation channel connects the lower part of the storage tank 301 and the processing tank 30. Additionally, the pipes L3 to L6, the valve V3, the pump P, and the drain tank 32 constitute a discharge channel. The discharge channel connects the lower part of the storage tank 301 and the drain tank 32.

The pump P includes a pair of suction port and an ejection port. The valve V3 includes one inlet and two outlets, and is a motorized valve which can switch the state where the inlet and one outlet are communicated with each other and the state where the inlet and the other outlet are communicated with each other under electric control.

The pipe L3 connects the lower part of the storage tank 301 and the suction port of the pump P. The pipe L4 connects the ejection port of the pump P and the inlet of the valve V3. The pipe L5 connects the first outlet of the valve V3 and the heater H. The pipe L6 connects the second outlet of the valve V3 and the drain tank 32. The pipe L7 connects the heater H and the filter F. The pipe L8 connects the filter F and the processing tank 30.

In the next place, the continuous etching method using the etching process apparatus 300 is described below with reference to FIG. 14.

Firstly, the first etching solution E according to the first embodiment is prepared in the processing tank 30. Specifically, a phosphoric acid aqueous solution and a sulfuric acid aqueous solution are mixed in so as to adjust the mass ratio between phosphoric acid and sulfuric acid a predetermined value, thereby obtaining a mixed solution. The phosphoric acid aqueous solution may be, for example, an 85 mass % phosphoric acid aqueous solution, or a heat-treated phosphoric acid aqueous solution. The phosphoric acid concentration in the heat-treated phosphoric acid aqueous solution is, for example, within the range of 85 mass % or more and 95 mass % or less, and the water concentration is, for example, within the range of 5 mass % or more and 15 mass % or less. The sulfuric acid aqueous solution may be, for example, a 96 mass % sulfuric acid aqueous solution.

Subsequently, a silicic acid compound source is further mixed with the mixed solution. Subsequently, using a heater (not shown) accompanying the processing tank 30, the mixed solution is heated to a temperature within the range of 130° C. to 180° C., thereby dissolving the silicic acid compound source in the mixed solution. In this manner, the first etching solution E according to the first embodiment is obtained. The first etching solution E accommodated in the processing tank 30 may be one prepared outside in place of the one prepared in the processing tank 30. The water concentration in the first etching solution E can be appropriately adjusted by adjusting the preparation temperature and heating time of the first etching solution E.

Subsequently, the silicon concentration in the first etching solution E is measured, thereby obtaining an initial silicon concentration A1. Subsequently, the substrate 10 to be processed illustrated in FIG. 11 is immersed for a definite time in the first etching solution E as a sample S. The sample S may be the structure illustrated in FIG. 4.

During the etching process, the same amount of water as the amount of water evaporated and decreased by heating of the first etching solution E is constantly added to the processing tank 30 from the water supply source W through the pipe L2, or supplied at regular intervals. The first etching solution E is constantly stirred by a stirrer (not shown) accompanying the processing tank 30.

During preparation of the first etching solution E and etching process, the first etching solution E overflown from the processing tank 30 is temporarily reserved in the storage tank 301. The first etching solution E flown from the storage tank 301 into the circulation channel is heated by the heater H accompanying the circulation channel, passes through the filter F, and returned to the processing tank 30. The filter F removes foreign matter from the first etching solution E.

Subsequently, after a lapse of a definite period of time, the silicon concentration in the first etching solution E is measured, thereby obtaining the first silicon concentration A2. When the first silicon concentration A2 is higher than the predetermined threshold of the silicon concentration, the valve V3 is switched from the state where the inlet and the first outlet are communicated to the state where the inlet and the second outlet are communicated. In this manner, the first etching solution E overflown from the processing tank 30 is introduced to the drain tank 32 through the discharge channel.

Subsequently, the buffer solution B is prepared in the buffer tank 31. Specifically, a phosphoric acid aqueous solution and a sulfuric acid aqueous solution are mixed so as to adjust the mass ratio between phosphoric acid and sulfuric acid to the same value as the mass ratio between sulfuric acid and phosphoric acid in the first etching solution E, thereby obtaining the buffer solution B.

Subsequently, the buffer solution B is supplied to the processing tank 30 through the pipe L1, thereby obtaining a mixed solution of the buffer solution B and the first etching solution E wherein the silicon concentration is the first silicon concentration A2. Subsequently, as necessary, a silicic acid compound source is added to and dissolved in the mixed solution in an amount which makes the silicon concentration the same concentration as the initial silicon concentration A1. In this manner, the second etching solution E' is obtained. The composition of the second etching solution E' is the same as the composition of the first etching solution E before immersing the sample S.

Subsequently, the sample S is subjected to etching process using the second etching solution E'. By repeating these processes, silicon nitride is selectively removed from the sample S. The number of repetition of these processes can be appropriately adjusted according to the amount of silicon nitride included in the sample S.

Then, by repeating a series of these processes, the sample S is continuously subjected to etching process.

Third Embodiment

The method for manufacturing an electronic component according to the third embodiment includes etching of silicon nitride using the etching solution according to the first embodiment.

Additionally, the method for manufacturing an electronic component according to the third embodiment may include etching a silicon nitride layer from a substrate having a silicon nitride layer and a silicon oxide layer by the etching method according to the second embodiment, and depositing a conductive material on at least a portion of the area from which a silicon nitride film has been removed.

Specifically, a substrate 10 illustrated in FIG. 11 is prepared. Subsequently, using the etching solution according to the first embodiment, a silicon nitride film 4 is selectively removed from the substrate illustrated in FIG. 11. In this manner, as illustrated in FIG. 12, a substrate having a pattern including plural projections including silicon oxide, and a trench T is obtained.

Subsequently, in this trench T, a conductive material is deposited using a sputtering method or a chemical vapor deposition (CVD) method. The conductive material may be, for example, a metal such as tungsten. The conductive material embedded in the trench T works as, for example, a control gate.

A semiconductor chip can be manufactured by the method including the above-described processes. Examples of the semiconductor chip include an integrated circuit (IC), a large scale integrated circuit (LSI), and a solid-state image pickup device. The integrated circuit is useful as, for example, a general-purpose memory and a dedicated memory. The solid-state image pickup device is, for example, a CMOS image sensor or a CCD sensor.

Subsequently, the semiconductor chip thus obtained is mounted on a circuit board. Subsequently, the gap between the semiconductor chip and the circuit board is filled with a sealing resin. In this manner, an electronic component such as a semiconductor package can be obtained.

As described above, the etching method according to the second embodiment allows selective removal of silicon nitride, so that a substrate having a desired shape with a small amount of side etching is obtained. Therefore, the method for manufacturing an electronic component according to the third embodiment can increase the yield of the electronic component.

Fourth Embodiment

In the next place, the etching solution according to the fourth embodiment is described. The etching solution according to the fourth embodiment is an etching solution used for etching of silicon nitride. The etching solution according to the fourth embodiment includes phosphoric acid, an acid having an acid dissociation exponent pK smaller than the first acid dissociation exponent $pK_{a1}$ of phosphoric acid, a silicic acid compound, and water. In the etching solution according to the fourth embodiment, the phosphoric acid concentration is 88 mass % or more and 95% mass % or less, the concentration of the acid having an acid dissociation exponent smaller than the first acid dissociation exponent $pK_{a1}$ of phosphoric acid is 2 mass % or more and 5 mass % or less, and the water concentration is 4 mass % or more and 11 mass % or less.

Water included in the etching solution works as an etchant for silicon nitride. Accordingly, if the amount of water in the etching solution is excessively small, the selection ratio tends to decrease. On the other hand, if the water content in the etching solution is high, the etching solution becomes easy to boil, the processing efficiency decreases, and the processing apparatus tends to be complicated. In the etching solution according to the fourth embodiment, the water concentration is 4 mass % or more and 11 mass % or less. This etching solution hardly boils during etching process, and achieves a high selection ratio. Accordingly, the use of the etching solution allows simplification of the etching process apparatus.

The water concentration in the etching solution is preferably within the range of 7.00 mass % or more and 9.00 mass % or less. When the water concentration is within this range, the selection ratio further increases. Additionally, the water concentration in the etching solution is more preferably within the range of 8.00 mass % or more and 9.00 mass % or less. When the water concentration in the etching solution is within this range, deposition of silicon oxide can be suppressed, so that a substrate having a desired shape is readily obtained.

Phosphoric acid included in the etching solution bonds with a portion of $Si(OH)_4$ formed by the above-described formulae (A) and (C), and causes dehydration condensation.

The acid having an acid dissociation exponent smaller than the first acid dissociation exponent $pK_{a1}$ of phosphoric acid included in the etching solution is preferably sulfuric acid. Sulfuric acid has a high inhibitory effect on deposition of silicon oxide. On the other hand, if sulfuric acid is excessively included in the etching solution, activity of water decreases, and the selection ratio may decrease. Accordingly, the sulfuric acid concentration included in the etching solution is preferably 4.00 mass % or less.

The concentration of silicon included in the etching solution is preferably 40 ppm or more. When an etching solution having a high silicon concentration is used, the selection ratio tends to increase. The silicon concentration included in the etching solution is preferably 160 ppm or less, and more preferably 100 ppm or less. When an etching solution having a low silicon concentration is used, deposition of silicon oxide can be suppressed, so that a substrate having a desired shape tends to be easily obtained.

Figure 15:
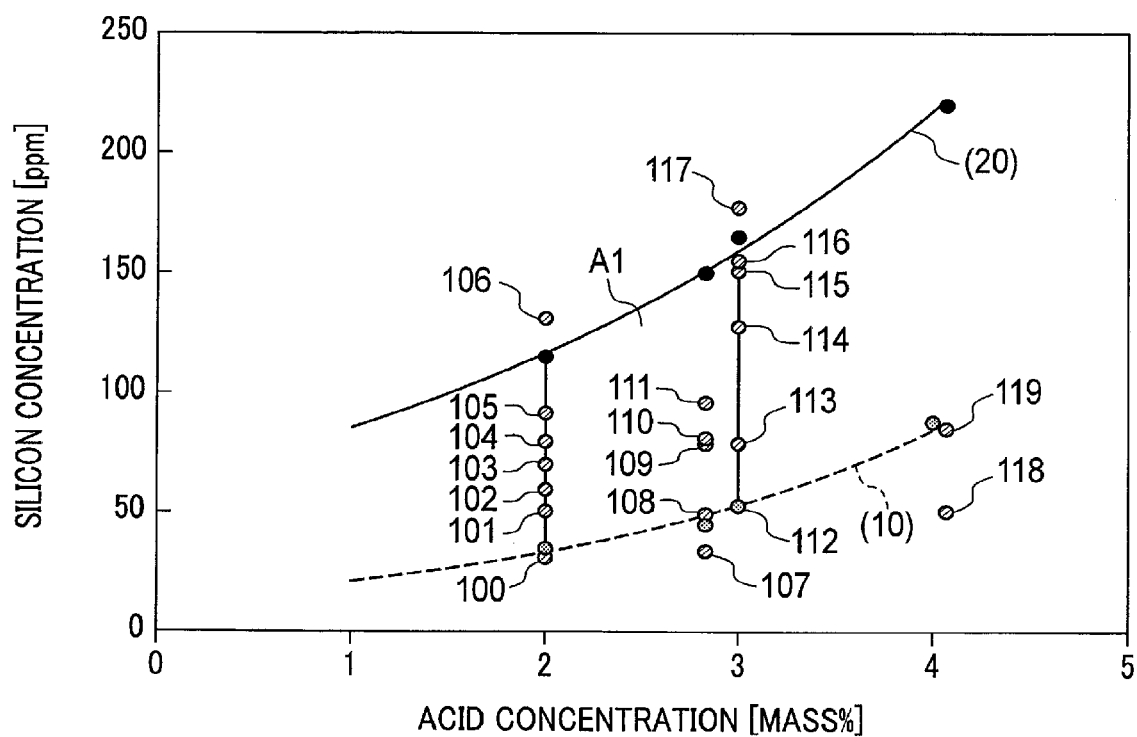
FIG. 15 is a graph illustrating an example of the relationship between the acid concentration and the silicon concentration in the etching solution according to the fourth embodiment.

In the etching solution according to the fourth embodiment, the preferred range of the silicon concentration can vary depending on the concentration of the acid having an acid dissociation exponent smaller than the first acid dissociation exponent $pK_{a1}$ of phosphoric acid. FIG. 15 is a graph illustrating an example of the relationship between the acid concentration and the silicon concentration in the etching solution according to the fourth embodiment. In this graph, the abscissa represents the concentration of the acid having an acid dissociation exponent smaller than the first acid dissociation exponent $pK_{a1}$ of phosphoric acid in the etching solution, and the ordinate represents the silicon concentration in the etching solution.

In the graph illustrated in FIG. 15, the lower line represented by a broken line indicates the lower limit of the preferred range of the silicon concentration at each acid concentration. On the lower line, the silicon concentration Y10 in the range of the acid concentration of 2.00 mass % or more and 3.00 mass % or less is represented by the following formula (10). The formula (10) is obtained by calculating from the results of the experiments carried out by the inventors, and the results of the below-described Example 101 to Example 119.

$$Y10 = 13.032 \times e(0.4683 \times X) \tag{10}$$

In the range of the acid concentration of 2.00 mass % or more and 3.00 mass % or less, if the silicon concentration is Y10 or more, the etching rate of silicon oxide decreases, and the selection ratio tends to be high. When the acid concentration is 2.00 mass %, the value of Y10 is approximately 33.248 ppm. When the acid concentration is 2.83 mass %, the value of Y10 is approximately 49.043 ppm. When the acid concentration is 3.00 mass %, the value of Y10 is approximately 53.107 ppm.

In the graph illustrated in FIG. 15, the upper line represented by a full line indicates the upper limit of the preferred range of the silicon concentration at each acid concentration. On the upper line, the silicon concentration Y20 in the range of the acid concentration of 2.00 mass % or more and 3.00 mass % or less is represented by the following formula (20). The formula (20) is obtained by calculating from the results of the experiments carried out by the inventors, and the results of the below-described Example 101 to Example 119.

$$Y20=62.238 \times e(0.3136 \times X) \tag{20}$$

In the range of the acid concentration of 2.00 mass % or more and 3.00 mass % or less, when the silicon concentration is Y20 or less, the selection ratio tends to increase and deposition of silicon oxide tends to be suppressed. When the acid concentration is 2.00 mass %, the value of Y20 is approximately 116.532 ppm. When the acid concentration is 2.83 mass %, the value of Y20 is approximately 151.177 ppm. When the acid concentration is 3.00 mass %, the value of Y20 is approximately 159.456 ppm.

In the graph illustrated in FIG. 15, the region A1 is surrounded by the broken line according to the formula (10), the full line according to the formula (20), the straight line of X=2, and straight line of X=3. In the etching solution, the silicon concentration and the sulfuric acid concentration are preferably established so as to be within the region A1 and on the respective lines. More specifically, when the sulfuric acid concentration X is within the range of 2.00 mass % or more and 3.00 mass % or less, the silicon concentration is preferably within the range of Y10 ppm or more and Y20 ppm or less. Using this etching solution, a substrate having a desired shape can be easily obtained.

Figure 16:
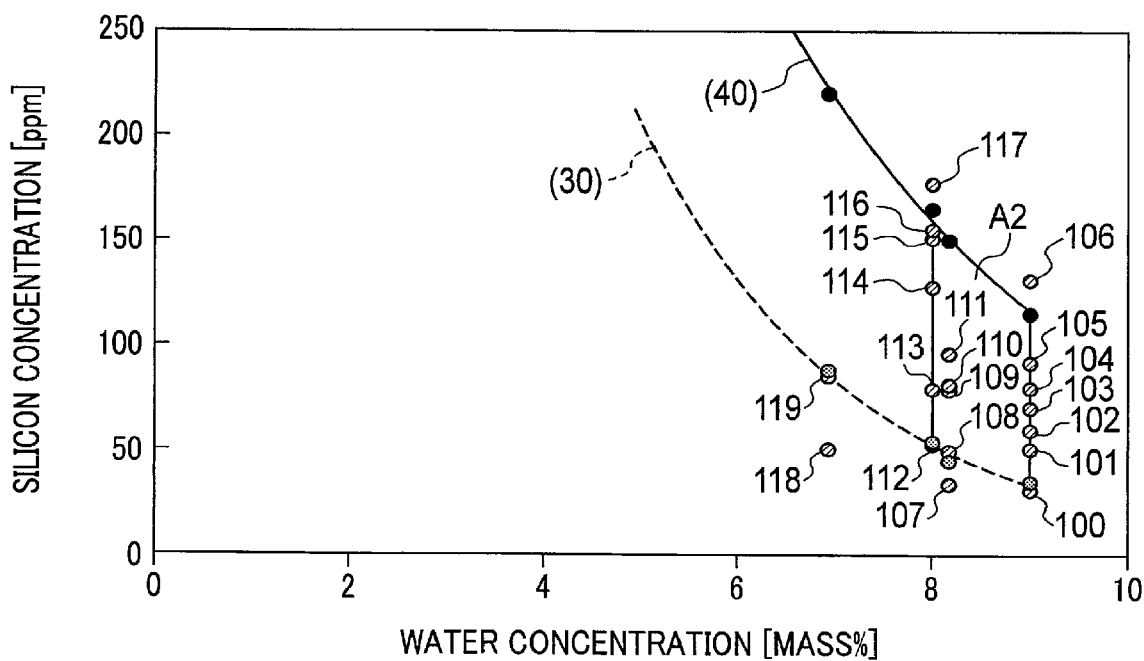
FIG. 16 is a graph depicting an example of the relationship between the water concentration and the silicon concentration in the etching solution according to the fourth embodiment.

In the etching solution according to the fourth embodiment, the preferred range of the silicon concentration can vary depending on the water concentration. FIG. 16 is a graph depicting an example of the relationship between the water concentration and the silicon concentration in the etching solution according to the fourth embodiment. In this graph, the abscissa represents the water concentration in the etching solution, and the ordinate represents the silicon concentration in the etching solution.

In the graph illustrated in FIG. 16, the lower line represented by a broken line represents the lower limit of the preferred range of the silicon concentration at each water concentration. On the lower line, the silicon concentration Y30 in the range of the water concentration of 8.00 mass % or more and 9.00 mass % or less is represented by the following formula (30). The formula (30) is obtained by calculating from the results of the experiments carried out by the inventors, and the results of the below-described Example 101 to Example 119.

$$Y30=1958.9 \times e(-0.453 \times X) \tag{30}$$

In the water concentration range of 8.00 mass % or more and 9.00 mass % or less, when the silicon concentration is Y30 or more, the etching rate of silicon oxide tends to decrease, and the selection ratio tends to increase. When the water concentration is 8.00 mass %, the value of Y30 is approximately 33.220 ppm. When the water concentration is 8.17 mass %, the value of Y30 is approximately 48.382 ppm. When the water concentration is 9.00 mass %, the value of Y30 is approximately 52.255 ppm.

In the graph illustrated in FIG. 16, the upper line represented by a full line indicates the upper limit of the preferred range of the silicon concentration at each water concentration. On the upper line, the silicon concentration Y40 in the water concentration range of 8.00 mass % or more and 9.00 mass % or less is represented by the following formula (40). The formula (40) is obtained by calculating from the results of the experiments carried out by the inventors, and the results of the below-described Example 101 to Example 119.

$$Y40=1958.7 \times e(-0.314 \times X) \tag{40}$$

In the water concentration range of 8.00 mass % or more and 9.00 mass % or less, when the silicon concentration is Y40 or less, the selection ratio tends to increase, and deposition of silicon oxide tends to be suppressed. When the water concentration is 8.00 mass %, the value of Y40 is approximately 116.052 ppm. When the water concentration is 8.17 mass %, the value of Y40 is approximately 150.604 ppm. When the water concentration is 9.00 mass %, the value of Y40 is approximately 158.862 ppm.

In the graph illustrated in FIG. 15, the region A2 is surrounded by a broken line according to the formula (30), a full line according to the formula (40), a straight line of X=8, and a straight line of X=9. In the etching solution, the silicon concentration and the water concentration are preferably established so as to be within the region A2 and on the respective lines. More specifically, when the water concentration X is within the range of 8.00 mass % or more and 9.00 mass % or less, the silicon concentration is preferably within the range of Y30 ppm or more and Y40 ppm or less. Using this etching solution, a substrate having a desired shape can be easily obtained.

The etching solution according to the fourth embodiment can be used in the etching method according to the second embodiment and the method for manufacturing an electronic component according to the third embodiment.

Fifth Embodiment

In the next place, the etching solution according to the fifth embodiment is described. The etching solution according to the fifth embodiment is an etching solution used for etching of silicon nitride. The etching solution according to the fifth embodiment includes phosphoric acid, an acid having an acid dissociation exponent smaller than the first acid dissociation exponent $pK_{a1}$ of phosphoric acid, hexafluorosilicic acid, and water.

The use of the etching solution according to the fifth embodiment allows etching process achieving a good balance among a high etching rate of silicon nitride, a high selection ratio, and suppression of deposition of silicon oxide.

A portion of hexafluorosilicic acid $H_2SiF_6$ is, as depicted by the following formula (A1), reacts with water ($H_2O$) to be decomposed into hydrogen fluoride (HF) and silicic acid ($Si(OH)_4$). This reaction is reversible.

$$H_2SiF_6+4H_2O \Leftrightarrow 6HF+Si(OH)_4 \tag{A1}$$

This hydrogen fluoride works as a strong etchant for silicon nitride ($Si_3N_4$), and decomposes silicon nitride into silicon tetrafluoride ($SiF_4$) and ammonia ($NH_3$) as represented by the following formula (A2). Accordingly, the use of an etching solution including hydrogen fluoride further increases the etching rate of silicon nitride in comparison with the case using an etching solution free from hydrogen fluoride. This reaction is irreversible.

$$Si_3N_4+12HF \rightarrow 3SiF_4+4NH_3 \tag{A2}$$

On the other hand, since hydrogen fluoride is a strong etchant, when an etching solution including hydrogen fluoride is used for processing of a substrate including silicon nitride and silicon oxide, silicon oxide is etched besides silicon nitride. Accordingly, the use of an etching solution including hydrogen fluoride tends to decrease the selection ratio.

As represented by the formula (A1), hexafluorosilicic acid $H_2SiF_6$ forms silicic acid $Si(OH)_4$ together with hydrofluoric acid (HF). Silicic acid $Si(OH)_4$ forms silicon oxide $(SiO_2)$ by dehydration reaction as represented by the formula (B). This reaction is reversible. Accordingly, the use of the etching solution including silicic acid $Si(OH)_4$ hinders etching of silicon oxide $(SiO_2)$.

More specifically, in this etching solution, the relationship between hexafluorosilicic acid $H_2SiF_6$, silicon oxide $(SiO_2)$, and silicic acid $Si(OH)_4$ is represented by the following formula (A3).

$$H_2SiF_6 \Leftrightarrow SiO_2 \Leftrightarrow Si(OH)_4 \qquad (A3)$$

As represented by the left-hand arrow in the formula (A3), a portion of silicon oxide $(SiO_2)$ etched by reaction with hydrogen fluoride (HF) chemically turns to hexafluorosilicic acid $H_2SiF_6$. This reaction is reversible. More specifically, when the concentration of hexafluorosilicic acid $H_2SiF_6$ in the etching solution increases, equilibrium of the reversible reaction on the left side in the formula (A3) shifts right. Additionally, when the concentration of silicic acid $Si(OH)_4$ in the etching solution increases, equilibrium of the reversible reaction on the right side of the formula (A3) shifts left. The etching solution including hexafluorosilicic acid $H_2SiF_6$ causes such shift of equilibrium, and thus allows suppression of etching of silicon oxide.

The etching solution according to the fifth embodiment further includes an acid having an acid dissociation exponent smaller than the first acid dissociation exponent $pK_{a1}$ of phosphoric acid. The acid suppresses polymerization of silicic acid $Si(OH)_4$ to form a multimer represented by $SiO_n(OH)_{4-2n}$. This multimer is chemically changed to silicon oxide $(SiO_2)$ in the etching solution, and can deposit in the etching solution. Accordingly, the use of the etching solution including an acid having an acid dissociation exponent smaller than the first acid dissociation exponent $pK_{a1}$ of phosphoric acid allows suppression of deposition of silicon oxide $(SiO_2)$.

Among the acids having an acid dissociation exponent smaller than the first acid dissociation exponent $pK_{a1}$ of phosphoric acid, sulfuric acid $(H_2SO_4)$ is highly effective as a polymerization inhibitor for silicic acid. The mechanism of the function of sulfuric acid as a polymerization inhibitor for silicic acid is described with reference to FIG. 17. FIG. 17 is an illustration describing the function of sulfuric acid as a polymerization inhibitor for silicic acid. As represented by the right side in FIG. 17, sulfuric acid is ionized into protons $(H^+)$ and hydrogen sulfate ions $(HSO_4^-)$. As represented in the above-described formula (E), a portion of hydrogen sulfate ions $(HSO_4^-)$ is ionized into proton $(H^+)$ and sulfate ions $(SO_4^-)$ These sulfate ions $(SO_4^-)$ forms hydrogen bonds with hydroxyl groups of silicic acid $Si(OH)_4$ as illustrated in FIG. 17. This inhibits polymerization of silicic acid $Si(OH)_4$.

The concentration of hexafluorosilicic acid $H_2SiF_6$ in the etching solution is preferably 0.1 mass % or more, more preferably 0.15 mass % or more, even more preferably 0.18 mass % or more, from the viewpoint of increasing the etching rate of silicon nitride. The concentration of hexafluorosilicic acid $H_2SiF_6$ in the etching solution is preferably 0.71 mass % or less, more preferably 0.25 mass % or less, and even more preferably 0.2 mass % or less from the viewpoint of suppressing etching of silicon oxide and increasing the selection ratio.

The concentration of the acid having an acid dissociation exponent smaller than the first acid dissociation exponent $pK_{a1}$ of phosphoric acid in the etching solution is preferably 0.70 mass % or more, more preferably 5.00 mass % or more, and even more preferably 10.00 mass % or more from the viewpoint of suppressing deposition of silicon oxide $(SiO_2)$.

On the other hand, if the concentration of the acid is excessively high, the etching rate of silicon nitride tends to decrease. Accordingly, from the viewpoint of increasing the etching rate of silicon nitride, the concentration of the acid in the etching solution is preferably 48.00 mass % or less, more preferably 30.00 mass % or less, and even more preferably 20.00 mass % or less.

The phosphoric acid concentration in the etching solution is preferably 63 mass % or more and 89 mass % or less. When the phosphoric acid concentration is within this range, both a high selection ratio and suppression of deposition of silicon oxide tend to be achieved.

The water concentration in the etching solution is preferably 6.00 mass % or more and 11.50 mass % or less. When the water concentration in the etching solution is within this range, the etching solution hardly boils during etching process, whereby processing efficiency is increased. The water concentration in the etching solution is more preferably 6.00 mass % or more and 8.00 mass % or less.

The etching solution according to the fifth embodiment may further include hydrogen fluoride (HF) in addition to phosphoric acid, an acid having an acid dissociation exponent smaller than the first acid dissociation exponent $pK_{a1}$ of phosphoric acid, hexafluorosilicic acid, and water. The etching rate of silicon nitride can be further increased by adding hydrogen fluoride (HF) to the etching solution in advance, beside hydrogen fluoride (HF) formed by decomposition of hexafluorosilicic acid. The concentration of the hydrogen fluoride added in advance is preferably 0.01 mass % or more and 0.10 mass % or less, and more preferably 0.03 mass % or more and 0.05 mass % or less.

The etching solution according to the fifth embodiment may include hydrogen fluoride (HF) and a silicic acid compound in place of hexafluorosilicic acid. This etching solution achieves the similar effect to the etching solution including hexafluorosilicic acid.

Figure 18:
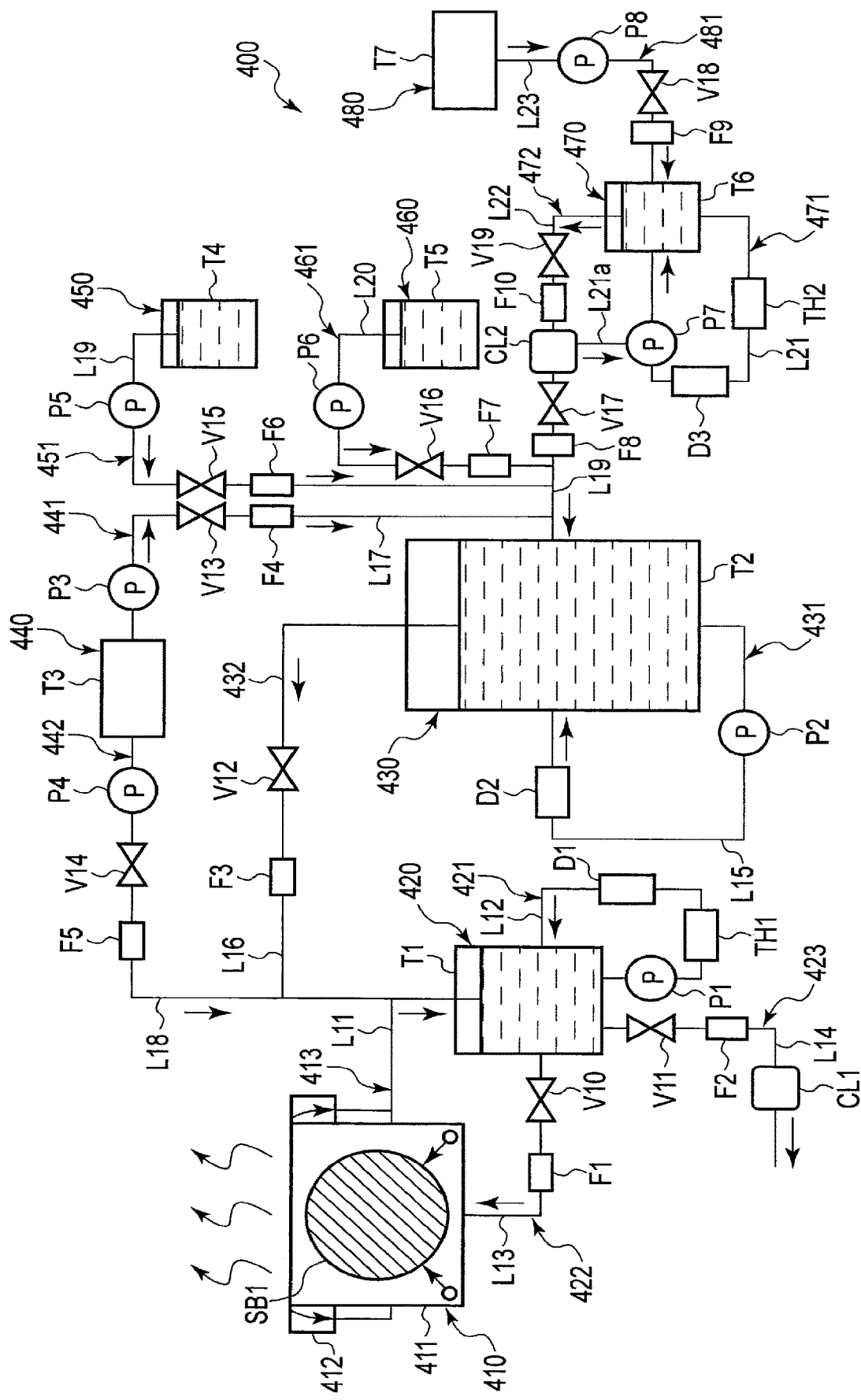
FIG. 18 is a diagram schematically illustrating a batch etching apparatus.

In the next place, an etching apparatus applicable to the etching solution according to the fifth embodiment is described with reference to FIG. 18. FIG. 18 is a diagram schematically illustrating a batch etching apparatus. A batch etching apparatus 400 illustrated in FIG. 18 includes processing part 410, an etching solution storage part 420, an etching solution preparation part 430, a water storage part 440, an acid storage part 450, an additive storage part 460, a high-density phosphoric acid storage part 470, a low concentration phosphoric acid storage part 480, and a control unit (not shown). As an example, sulfuric acid is used as the acid having an acid dissociation exponent smaller than the first acid dissociation exponent $pK_{a1}$ of phosphoric acid. In FIG. 18, the direction of an arrow represents the fluid flow direction.

The processing part 410 includes a processing tank 411 for carrying out etching process on the processing substrate to be processed, a storage tank 412 for storing an etching solution, and a recovery part 413 for recovering the overflown etching solution. The processing tank 411 accommodates the etching solution and the processing substrate SB1. The storage tank 412 surrounds the region adjacent to the upper layer of the processing tank 411, and forms a storage part which can store the etching solution overflown from the processing tank 411. The recovery part 413 includes a pipe L11 connecting the lower part of the storage tank 412 and the tank Ti. The pipe L11 may include a filter for removing impurities.

The etching solution storage part 420 includes the tank T1 accommodating the etching solution, a circulation part 421 heating and circulating the etching solution, thereby detecting the temperature of the etching solution and the concentration of each component, a supply part 422 supplying the etching solution to the processing tank 411, and a discharge part 423 discharging the etching solution outside.

The circulation part 421 includes a pipe L12 connecting the lower part of the tank T1 and the upper part of the tank T1. Within the pipe L12, a pump P1, a heater TH1 with a thermometer, and a densitometer D1 which can measure the phosphoric acid concentration, hexafluorosilicic acid, and sulfuric acid. The pump P1, the densitometer D1, and the heater TH1 with a thermometer are connected to a control unit (not shown). The pipe L12 may include a filter for removing impurities.

The supply part 422 includes a pipe L13 connecting the tank T1 and the processing tank 411. Within the pipe L13, a valve V10 and a flowmeter F1 are included. The valve V10 and the flowmeter F1 are connected to a control unit (not shown).

The discharge part 423 includes a pipe L14 connecting the lower part of the tank T1 and the outside of the etching apparatus 400. Within the pipe L14, a valve V11, a flowmeter F2, and a cooling unit CL1 are included. The valve V11, the flowmeter F2, and the cooling unit CL1 are connected to a control unit (not shown).

The etching solution preparation part 430 includes a tank T2 accommodating raw materials of the etching solution and preparing the etching solution, a circulation part 431 circulating the etching solution and detecting the concentration of the components in the etching solution, and a supply part 432 supplying the etching solution to the tank T1.

The circulation part 431 includes a pipe L15 connecting the lower part of the tank T2 and the upper portion of the tank T2. Within the pipe L15, a pump P2 and a densitometer D2 for phosphoric acid, hexafluorosilicic acid, and sulfuric acid are included. The pump P2 and the densitometer D2 are connected to a control unit (not shown).

The supply part 432 includes a pipe L16 connecting the tank T2 and the pipe L11. Within the pipe L16, a valve V12 and a flowmeter F3 are included. The valve V12 and the flowmeter F3 are connected to a control unit (not shown). The pipe L16 may be connected to the tank T1 in place of the pipe L11.

The water storage part 440 includes a tank T3 storing water ($H_2O$), a first supply part 441 supplying water to the tank T2, and a second supply part 442 supplying water to the tank T1.

The first supply part 441 includes a pipe L17 connecting the tank T3 and the tank T2. Within the pipe L17, a pump P3, a valve V13, and a flowmeter F4 are included. The pump P3, the valve V13, and the flowmeter F4 are connected to a control unit (not shown).

The second supply part 442 includes a pipe L18 connecting the tank T3 and the pipe L16. Within the pipe L18, a pump P4, a valve V14, and a flowmeter F5 are included. The pump P4, the valve V14, and the flowmeter F5 are connected to a control unit (not shown). The pipe L18 may be connected to the pipe L11, or connected to the tank T1 in place of the pipe L16.

The acid storage part 450 includes a tank T4 accommodating a sulfuric acid aqueous solution, and a supply part 451 supplying the sulfuric acid aqueous solution to the tank T2. The sulfuric acid concentration in the sulfuric acid aqueous solution is, for example, 98 mass %.

The supply part 451 includes a pipe L19 connecting the tank T4 and the pipe L17. Within the pipe L19, a pump P5, a valve V15, and a flowmeter F6 are included. The pump P5, the valve V15, and the flowmeter F6 are connected to a control unit (not shown). The pipe L19 may be connected to the tank T2 in place of the pipe L17.

The additive storage part 460 includes a tank T5 accommodating a hexafluorosilicic acid aqueous solution, and a supply part 461 supplying the hexafluorosilicic acid aqueous solution to the tank T2. The concentration of hexafluorosilicic acid in the hexafluorosilicic acid aqueous solution is, for example, 40 mass %. The tank T5 may include hydrogen fluoride in addition to hexafluorosilicic acid.

The supply part 461 includes a pipe L20 connecting the tank T5 and the pipe L19. Within the pipe L20, a pump P6, a valve V16, and a flowmeter F7 are included. The pump P6, the valve V16, and the flowmeter F7 are connected to a control unit (not shown). The pipe L20 may be connected to the pipe L17 or the tank T2 in place of the pipe L19.

The high-density phosphoric acid storage part 470 includes a tank T6 accommodating a high-density phosphoric acid aqueous solution, a circulation part 471 heating and circulating a phosphoric acid aqueous solution, thereby increasing the concentration of the phosphoric acid aqueous solution, and a supply part 472 supplying the high-density phosphoric acid aqueous solution to the tank T2. The phosphoric acid concentration in the high-density phosphoric acid aqueous solution is, for example, 98 mass %.

The circulation part 471 includes a pipe L21 connecting the lower part of the tank T6 and the upper part of the tank T6, and a pipe L21a connecting a cooling unit CL2 with a thermometer and the pipe L21. Within the pipe L21, a heater TH2 with a thermometer, a phosphoric acid densitometer D3, and a pump P7 are included. The heater TH2 with a thermometer, the phosphoric acid densitometer D3, and the pump P7 are connected to a control unit (not shown).

The supply part 472 includes a pipe L22 connecting the tank T6 and the pipe L20. Within the pipe L22, a valve V19, a flowmeter F10, the cooling unit CL2 with a thermometer, a valve V17, and a flowmeter F8 are included. The valve V19, the flowmeter F10, the cooling unit CL2 with a thermometer, the valve V17, and the flowmeter F8 are connected to a control unit (not shown). The pipe L22 may be connected to the pipe L19, the pipe L17, or the tank T2 in place of the pipe L20.

The low concentration phosphoric acid storage part 480 includes a tank T7 accommodating a low concentration phosphoric acid aqueous solution, and a supply part 481 supplying a heated low concentration phosphoric acid aqueous solution to the tank T6. The phosphoric acid concentration in the low concentration phosphoric acid aqueous solution is, for example, 85 mass %.

The supply part 481 includes a pipe L23 connecting the tank T7 and the tank T6. Within the pipe L23, a pump P8, a valve V18, and a flowmeter F9 are included. The pump P8, the valve V18, and the flowmeter F9 are connected to a control unit (not shown).

In the batch etching apparatus 400 thus constituted, etching process is carried out according to the below-described first to twelfth operations under control by the control unit.

Firstly, as the first operation, the valve V18 is opened, and the pump P8 and the flowmeter F9 are actuated. As a result of this, a predetermined amount of the low concentration phosphoric acid aqueous solution accommodated in the tank T7 is supplied to the tank T6.

Subsequently, as the second operation, the heater TH2 with a thermometer, the phosphoric acid densitometer D3, and the pump P7 are actuated. As a result of this, the low concentration phosphoric acid aqueous solution accommodated in the tank T6 circulates in the tank T6 and the pipe L21, and heated to a predetermined temperature by the heater TH2 with a thermometer. This operation is carried out until the phosphoric acid concentration in the pipe L21 detected by the phosphoric acid densitometer D3 reaches the predetermined concentration. The high-density phosphoric acid aqueous solution thus prepared is kept at a predetermined temperature and a predetermined concentration.

Subsequently, as the third operation, the valve V19 and the valve V17 are opened, and the cooling unit CL2 with a thermometer, the flowmeter F10, and the flowmeter F8 are actuated. As a result of this, a predetermined amount of the high-density phosphoric acid aqueous solution accommodated in the tank T6 is cooled to a predetermined temperature by the cooling unit CL2 with a thermometer, and supplied to the tank T2. When the high-density phosphoric acid aqueous solution is not cooled to a predetermined temperature with the cooling unit CL2 with a thermometer, the high-density phosphoric acid aqueous solution is recovered into the circulation part 471 through the pipe L21a. As a result of this, only the high-density phosphoric acid aqueous solution sufficiently cooled by the cooling unit CL2 with a thermometer is supplied to the tank T2.

Subsequently, as the fourth operation, the valve V13 is opened, and the pump P3 and the flowmeter F4 are actuated. As a result of this, a predetermined amount of water accommodated in the tank T3 is supplied to the tank T2.

Subsequently, as the fifth operation, the valve V15 is opened, and the pump P5 and the flowmeter F6 are actuated. As a result of this, a predetermined amount of the sulfuric acid aqueous solution accommodated in the tank T4 is supplied to the tank T2.

Subsequently, as the sixth operation, the valve V16 is opened, and the pump P6 and the flowmeter F7 are actuated. As a result of this, a predetermined amount of the hexafluorosilicic acid aqueous solution accommodated in the tank T5 is supplied to the tank T2.

Subsequently, as the seventh operation, the pump P2 and densitometer D2 is actuated. As a result of this, the high-density phosphoric acid aqueous solution, water, hexafluorosilicic acid aqueous solution, and sulfuric acid aqueous solution supplied to the tank T2 are thoroughly mixed while circulating in the tank T2 and the pipe L15.

The densitometer D2 detects the phosphoric acid concentration, the sulfuric acid concentration, and the concentration of hexafluorosilicic acid in the solution circulating in the pipe L15, and the information transmits to the control unit through wiring (not shown). Based on this information, the control unit adjusts the supply amount and temperature of the high-density phosphoric acid aqueous solution, water, sulfuric acid aqueous solution, and hexafluorosilicic acid aqueous solution. In this manner, an etching solution is prepared. The etching solution thus prepared is maintained at a predetermined temperature and a predetermined composition.

Subsequently, as the eighth operation, the valve V12 is opened, and the flowmeter F3 is actuated. As a result of this, a predetermined amount of the etching solution accommodated in the tank T2 is supplied to the tank T1.

Subsequently, as the ninth operation, the pump P1, the heater TH1 with a thermometer, and the densitometer D1 are actuated. As a result of this, the etching solution supplied to the tank T1 circulates in the tank T1 and the pipe L2, and heated to a predetermined temperature with the heater TH1 with a thermometer. The densitometer D1 detects the phosphoric acid concentration, the sulfuric acid concentration, and the concentration of hexafluorosilicic acid in the solution circulating in the pipe L2, and transmits the information to the control unit through wiring (not shown).

Subsequently, as the tenth operation, preparation of a buffer solution and adjustment of its temperature are carried out based the information transmitted to the control unit. More specifically, at high temperature, water and hydrogen fluoride can be evaporated from the etching solution. In order to prevent changes in the composition of the etching solution caused by the concentration decrease, the control unit supplies water and a buffer solution to the tank T1. When water is supplied, the valve V14 is opened, and the pump P4 and the flowmeter F5 are actuated. As a result of this, water is supplied to the tank T1 in such a manner that the composition of the etching solution has predetermined values. When a buffer solution is supplied, the first to the eighth operation are repeated, a buffer solution for adjusting the composition of the etching solution is prepared, and the buffer solution is supplied to the tank Ti. As a result of this, composition of the components of the etching solution in the tank T1 is always kept at a predetermined value. The tenth operation may be carried out also in the below-described eleventh operation and twelfth operation.

Subsequently, as the eleventh operation, the valve V10 is opened, and the flowmeter F1 is actuated. As a result of this, the etching solution is supplied to the processing tank 411. The etching solution overflown from the processing tank 411 is temporarily stored in the storage tank 412, and then recovered into the tank T1 through the pipe L11.

Subsequently, as the twelfth operation, the processing substrate SB1 is immersed into the processing tank 411 filled with the etching solution. As a result of this, silicon nitride in the processing substrate is selectively etched. After the lapse of a predetermined time, the processing substrate SB1 is taken out from the processing tank 411, and dried.

The processing substrate is continuously processed by repeating all of the above-described first to twelfth operations, or the ninth to twelfth operations. After completion of the etching process, or when the amount of impurities in the etching solution markedly increases, the valve V11 is opened, the flowmeter F2 and the cooling unit CL1 are actuated, and as a result of this, the cooled etching solution is discharged to the outside of the apparatus.

An etching apparatus including an etching solution preparation mechanism is described as an example, the etching solution may be prepared outside of the etching apparatus. In this case, the acid storage part 450, the additive storage part 460, the high-density phosphoric acid storage part 470, and the low concentration phosphoric acid storage part 480 may be omitted. The etching solution preparation part 430 may be omitted.

Figure 19:
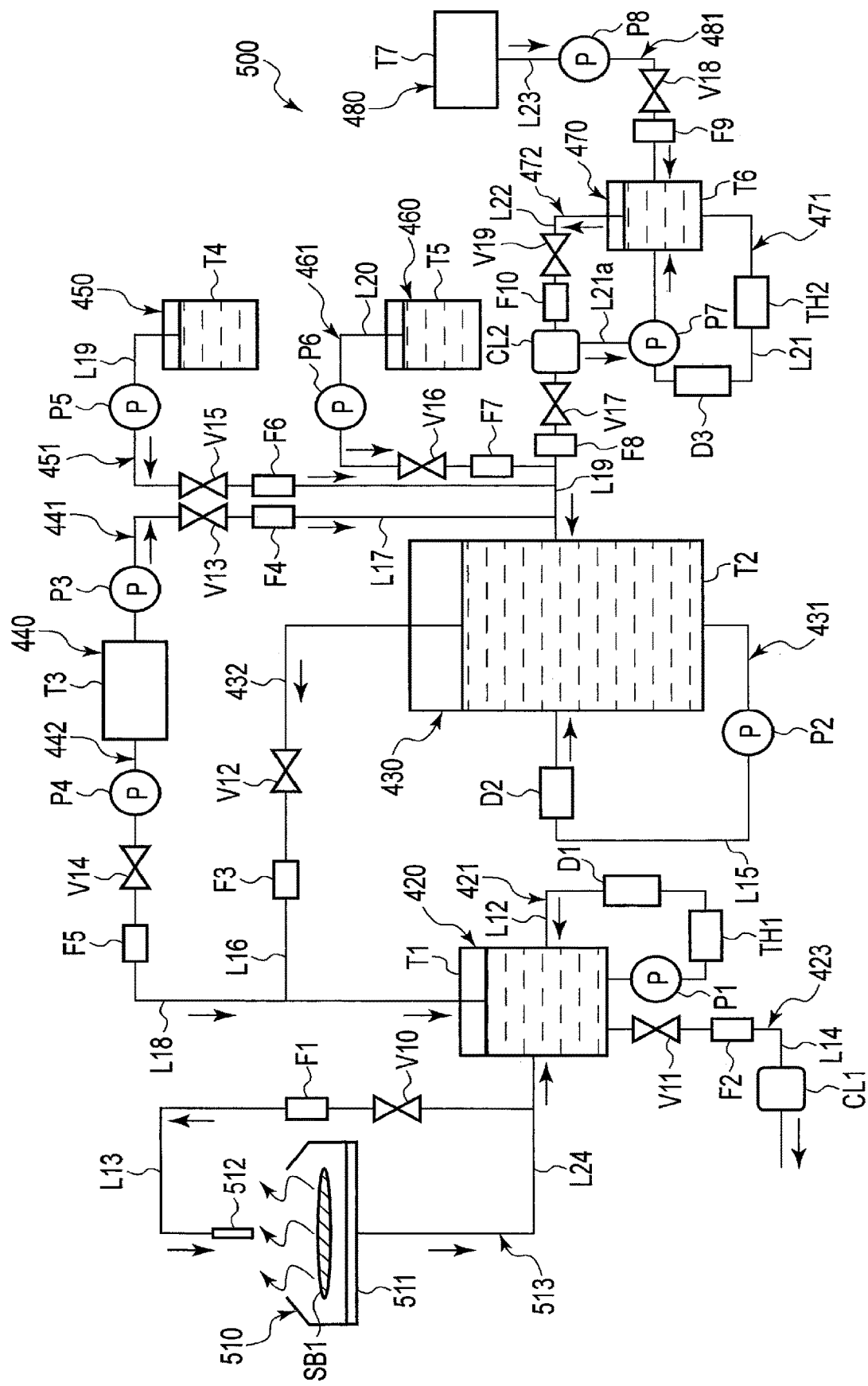
FIG. 19 is a diagram schematically illustrating a single wafer etching apparatus.

In the next place, other etching apparatus applicable to the etching solution according to the fifth embodiment is described with reference to FIG. 19. FIG. 19 is a diagram schematically illustrating a single wafer etching apparatus. A single wafer etching apparatus 500 illustrated in FIG. 19 has the similar structure as the above-described batch etching apparatus 400, except that a single-wafer processing part 510 is included in place of the processing part 410. Description of the parts indicated with the same reference numerals is omitted.

The single-wafer processing part 510 include a processing tank 511 accommodating an etching solution and the processing substrate SB1, a nozzle 512 supplying the etching solution to the processing substrate SB1, a rotation mechanism rotating the processing substrate, and a recovery part 513. In FIG. 19, the rotation mechanism is omitted. The nozzle 512 is connected to an end of the pipe L11. The recovery part 513 includes a pipe L24 connecting the lower part of the processing tank 511 and the tank T1. The pipe L24 may include a filter for removing impurities.

In the next place, etching process of the processing substrate SB1 using the single wafer etching apparatus 500 is described with reference to FIG. 19.

Firstly, in the same manner as described above, the first to the tenth operations are carried out.

Subsequently, as the eleventh operation, the processing substrate SB1 is mounted on the rotation mechanism in the processing tank 511. Subsequently, the rotation mechanism is operated, and the processing substrate SB1 is rotated at a predetermined speed.

Subsequently, as the twelfth operation, the valve V10 is opened, and the flowmeter F1 is actuated. As a result of this, the etching solution is supplied to the rotating processing substrate SB1 from the nozzle 512 connected to the pipe L11. As a result of this, silicon nitride in the processing substrate is selectively etched. After the elapse of a predetermined time, the processing substrate SB1 is taken out from the processing tank 511, and dried. The etching solution accumulated in the lower part in the processing tank 511 is recovered into the tank T1 through the pipe L24.

The processing substrate is continuously processed by repeating the above-described all of the first to twelfth operations, or the ninth to twelfth operations.

The etching solution according to the fifth embodiment includes phosphoric acid, an acid having an acid dissociation exponent smaller than the first acid dissociation exponent $pK_{a1}$ of phosphoric acid, hexafluorosilicic acid, and water. Accordingly, the use of the etching solution according to the fifth embodiment allows etching process achieving a good balance among a high etching rate of silicon nitride, a high selection ratio, and suppression of deposition of silicon oxide.

The etching solution according to the fifth embodiment may be used in the above-described etching method according to the second embodiment and the method for manufacturing an electronic component according to the third embodiment.

The above-described etching solution may be used for etching of a nitride other than silicon nitride. Examples of the nitride other than silicon nitride include gallium nitride (GaN), aluminum nitride gallium (AlGaN), and indium nitride aluminum gallium (InGaAlN). More specifically, the above-described etching solution may be used as an etching solution for manufacturing a power device including a nitride semiconductor.

EXAMPLES

Examples of the present invention are described below.

Example 1

Firstly, a substrate to be processed illustrated in FIG. 11 was prepared. The substrate to be processed included a substrate, projections including silicon oxide, and projections including silicon nitride. The projections including silicon oxide and the projections including silicon nitride were provided on both surfaces of the substrate, and extended vertically to the main surface of the substrate. The projections including silicon oxide and the projections including silicon nitride were alternately arranged parallel to the main surface of the substrate.

Subsequently, using the etching process apparatus illustrated in FIG. 14, the substrate to be processed was subjected to etching process. The temperature of the etching solution was 155° C. In the etching solution used for the etching process, the sulfuric acid concentration was 0.58 mass %, the silicon concentration was 0 ppm, the phosphoric acid concentration was 84.49 mass %, and the water concentration was 14.03 mass %. The preparation of the etching solution used an 85 mass % phosphoric acid aqueous solution and a 96 mass % sulfuric acid aqueous solution.

Example 2 to Example 49

Etching process was carried out in the same manner as described in Example 1, except that an etching solution was prepared according to the composition listed in Table 1 to Table 3.

The relationship between the sulfuric acid concentration and the silicon concentration in the etching solution of Example 1 to Example 49 is illustrated in FIG. 1.

In Example 2 to Example 9, Example 11 to Example 18, Example 20 to Example 25, Example 27, Example 29, Example 30, and Example 32 to Example 49, silicon nitride was used as the silicic acid compound source. In Example 47, a 1.18 mass % an aqueous hydrochloric acid solution was used an as a raw material of the etching solution, in place of a sulfuric acid aqueous solution. In Example 48 and Example 49, sodium chloride was used as a salt including a monovalent cation having a hydration number of 3.5 or less.

Example A to Example F

Firstly, the substrate to be processed illustrated in FIG. 11 was prepared. Subsequently, an etching solution was prepared to have the composition given in Table 4. In Example A to Example E, silicon nitride was used as a silicic acid compound source. Additionally, a 94.18 mass % phosphoric acid aqueous solution was used as a raw material of the etching solution. The 94.18 mass % phosphoric acid aqueous solution was prepared by heating an 85 mass % phosphoric acid aqueous solution. Subsequently, using the etching process apparatus, the substrate to be processed was subjected to etching process. The temperature of the etching solution was 156° C.

<Measurement of Etching Rate>

The substrates after etching process obtained in Example 1 to Example 49 and Example A to Example E were observed with an electron microscope, thereby measuring the etching amounts of silicon nitride and silicon oxide. The etching amount herein means the decrement of the thickness in a direction perpendicular to the main surface of the substrate at the projections of silicon nitride and projections of silicon oxide provided on the both surfaces of the substrate.

Subsequently, the etching rate of silicon nitride $ER_{SiN}$ and the etching rate of silicon oxide $ER_{SiO}$ were calculated from the etching amounts of silicon nitride and silicon oxide per unit time. In some examples, the sign of the etching rate of silicon oxide $ER_{SiO}$ was negative. The etching rate of silicon oxide $ER_{SiO}$ having a negative sign is considered to mean the deposition amount of silicon oxide per unit time.

Subsequently, the ratio of the etching rate of silicon nitride $ER_{SiN}$ to the etching rate of silicon oxide $ER_{SiO}$ was determined, and the selection ratio $ER_{SiN}/ER_{SiO}$ was calculated. In the example wherein the sign of the etching rate of silicon oxide $ER_{SiO}$ was negative, the sign of the selection ratio was negative. The high selection ratio herein means the high absolute value of the selection ratio.

The results are listed in Table 1 and Table 2.

<Evaluation of Deposition Level>

The substrates after etching process obtained in Example 1 to Example 49 and Example A to Example F were observed with an electron microscope, thereby evaluating the deposition level of silicon oxide. In this evaluation, the condition where the ratio of the width W1 at the tip of the projections of silicon oxide in a direction parallel to the main surface of the substrate after etching process to the width W0 at the tip of the projections of silicon oxide in a direction parallel to the main surface of the substrate before etching process, or ratio W1/W0 was smaller than 0.8, more specifically, the side etching amount was large was defined as the deposition level 1.

Additionally, the condition where the ratio W1/W0 was within the range of 0.8 or more and 1.05 or less was defined as the deposition level 2. The condition where the ratio W1/W0 was within the range of more than 1.05 and 1.2 or less was defined as the deposition level 3. The condition where the ratio W1/W0 was within the range of more than 1.2 and 2 or less was defined as the deposition level 4. The condition where the ratio W1/W0 was 2 or more and the trench T illustrated in FIG. 13 was completely blocked by the deposit 201 was defined as the deposition level 5.

The width W1 at the tip was obtained by, when deposition was observed on the projections of silicon oxide, adding the width X of the deposit 201 illustrated in FIG. 13 to the width W0 at the tip of the projections of silicon oxide in a direction parallel to the main surface of the substrate before etching process.

The results are listed in Table 1 to Table 4.

TABLE 1

| | | Etching solution | | | | | | Evaluation result | | | |
|---|---|---|---|---|---|---|---|---|---|---|---|
| | | First acid concentration (mass %) | Silicon concentration (ppm) | Phosphoric acid concentration (mass %) | Water concentration (mass %) | Salt concentration (mol/L) | Phosphoric acid mass/ acid mass | $ER_{SiN}$ (nm/min) | $ER_{SiO}$ (nm/min) | Selection ratio ($ER_{SiN}/ER_{SiO}$) | Deposition level |
| | First acid | | | | | | | | | | |
| Ex. 1 | Sulfuric acid | 0.58 | 0 | 84.49 | 14.93 | 0 | 145.67 | 5.4053 | 0.101254 | 53.3836 | 1 |
| Ex. 2 | Sulfuric acid | 0.58 | 24.23 | 84.49 | 14.93 | 0 | 145.67 | 6.0413 | 0.0145 | 416.641 | 2 |
| Ex. 3 | Sulfuric acid | 0.58 | 30.38 | 84.49 | 14.93 | 0 | 145.67 | 6.88736 | 0.00391 | 1761.47 | 2 |
| Ex. 4 | Sulfuric acid | 0.58 | 37.19 | 84.49 | 14.93 | 0 | 145.67 | 7.7002 | 0.0022 | 3500.09 | 2 |
| Ex. 5 | Sulfuric acid | 0.58 | 41.581 | 84.49 | 14.93 | 0 | 145.67 | 5.26221 | 0.00054 | 9725.02 | — |
| Ex. 6 | Sulfuric acid | 0.58 | 47.42 | 84.49 | 14.93 | 0 | 145.67 | 5.86802 | 0.00088 | 6670.48 | — |
| Ex. 7 | Sulfuric acid | 0.58 | 55.19 | 84.49 | 14.93 | 0 | 145.67 | 6.57124 | −0.0018 | −3707.7 | 3 |
| Ex. 8 | Sulfuric acid | 0.58 | 63.58 | 84.49 | 14.93 | 0 | 145.67 | 7.41388 | −0.0048 | −1560.8 | 3 |
| Ex. 9 | Sulfuric acid | 0.58 | 72.76 | 84.49 | 14.93 | 0 | 145.67 | 8.86315 | −0.00088 | −10072 | 3 |
| Ex. 10 | Sulfuric acid | 1.45 | 0 | 83.72 | 14.83 | 0 | 57.74 | 5.1349 | 0.1002 | 51.2465 | 1 |
| Ex. 11 | Sulfuric acid | 1.45 | 26.97 | 83.72 | 14.83 | 0 | 57.74 | 5.7481 | 0.0109 | 527.349 | 2 |
| Ex. 12 | Sulfuric acid | 1.45 | 28.76 | 83.72 | 14.83 | 0 | 57.74 | 6.3121 | 0.0076 | 830.54 | 2 |
| Ex. 13 | Sulfuric acid | 1.45 | 29.82 | 83.72 | 14.83 | 0 | 57.74 | 5.6352 | 0.0055 | 1024.58 | 2 |
| Ex. 14 | Sulfuric acid | 1.45 | 30.72 | 83.72 | 14.83 | 0 | 57.74 | 6.8789 | 0.0022 | 3126.77 | 2 |
| Ex. 15 | Sulfuric acid | 1.45 | 31.57 | 83.72 | 14.83 | 0 | 57.74 | 6.4497 | −0.003 | −2149.9 | 2 |
| Ex. 16 | Sulfuric acid | 1.45 | 43.97 | 83.72 | 14.83 | 0 | 57.74 | 7.5819 | −0.0074 | −1024.58 | 2 |
| Ex. 17 | Sulfuric acid | 1.45 | 48.7 | 83.72 | 14.83 | 0 | 57.74 | 8.4067 | 0.0006 | 14011.2 | 2 |
| Ex. 18 | Sulfuric acid | 1.45 | 50.29 | 83.72 | 14.83 | 0 | 57.74 | 7.704 | −0.002 | −3852 | 3 |
| Ex. 19 | Sulfuric acid | 17.17 | 0 | 69.8 | 12.42 | 0 | 4.07 | 8.15931 | 0.17234 | 47.3454 | 1 |
| Ex. 20 | Sulfuric acid | 17.17 | 10.1 | 69.8 | 12.42 | 0 | 4.07 | 8.21 | 0.036 | 223.824 | 2 |
| Ex. 21 | Sulfuric acid | 17.17 | 11.96 | 69.8 | 12.42 | 0 | 4.07 | 8.3836 | 0.0539 | 155.54 | 2 |
| Ex. 22 | Sulfuric acid | 17.17 | 16.21 | 69.8 | 12.42 | 0 | 4.07 | 8.2327 | 0.003 | 2744 | 4 |
| Ex. 23 | Sulfuric acid | 17.17 | 18.17 | 69.8 | 12.42 | 0 | 4.07 | 4.24794 | −0.0099 | −429.08 | 5 |
| Ex. 24 | Sulfuric acid | 17.17 | 13.36 | 69.8 | 12.42 | 0 | 4.07 | 7.2691 | 0.0413 | 176.007 | 2 |
| Ex. 25 | Sulfuric acid | 17.17 | 14.56 | 69.8 | 12.42 | 0 | 4.07 | 7.4997 | 0.00994 | 754.5 | 2 |
| Ex. 26 | Sulfuric acid | 48.21 | 0 | 39.55 | 12.24 | 0 | niti | 4.687 | 0.0419 | 111.862 | 5 |
| Ex. 27 | none | 0 | 63.58 | 89 | 11 | 0 | — | 7.74966 | 0.06643 | 116.659 | 1 |

TABLE 2

| | | Etching solution | | | | | | Evaluation result | | | |
|---|---|---|---|---|---|---|---|---|---|---|---|
| | | First acid concentration (mass %) | Silicon concentration (ppm) | Phosphoric acid concentration (mass %) | Water concentration (mass %) | Salt concentration (mol/L) | Phosphoric acid mass/ acid mass | $ER_{SiN}$ (nm/min) | $ER_{SiO}$ (nm/min) | Selection ratio ($ER_{SiN}/ER_{SiO}$) | Deposition level |
| | First acid | | | | | | | | | | |
| Ex. 28 | Sulfuric acid | 5.78 | 0 | 79.88 | 14.34 | 0 | 13.82 | 5.95757 | 0.07923 | 75.1915 | 1 |
| Ex. 29 | Sulfuric acid | 5.78 | 18.48 | 79.88 | 14.34 | 0 | 13.82 | 6.3738 | 0.0139 | 458.548 | 2 |
| Ex. 30 | Sulfuric acid | 5.78 | 33.26 | 79.88 | 14.34 | 0 | 13.82 | 6.9411 | −0.006 | −1156.9 | 4 |
| Ex. 31 | Sulfuric acid | 2.9 | 0 | 82.44 | 14.67 | 0 | 28.43 | 5.50071 | 0.09494 | 57.9388 | 1 |

TABLE 2-continued

| | | Etching solution | | | | | | Evaluation result | | | |
|---|---|---|---|---|---|---|---|---|---|---|---|
| | | First | | Phosphoric | | | | | | | |
| | First acid | acid concentration (mass %) | Silicon concentration (ppm) | acid concentration (mass %) | Water concentration (mass %) | Salt concentration (mol/L) | Phosphoric acid mass/ acid mass | $ER_{SiN}$ (nm/ min) | $ER_{SiO}$ (nm/ min) | Selection ratio ($ER_{SiN}$/ $ER_{SiO}$) | Deposition level |
| Ex. 32 | Sulfuric acid | 2.9 | 34.58 | 82.44 | 14.67 | 0 | 28.43 | 6.2024 | −0.003 | −2067.5 | 3 |
| Ex. 46 | Sulfuric acid | 47.5 | 5 | 42.93 | 9.57 | 0 | 0.90 | 3.5064 | 0.001119 | 3133 | 5 |
| Ex. 47 | Hydrochloric acid | 1.1807 | 15.83 | 82.13 | 16.687 | 0 | 69.56 | 3.8487 | 0.002 | 1924.35 | 2 |
| Ex. 48 | Sulfuric acid | 17.17 | 11.88 | 69.8 | 12.42 | 0.05 | 4.07 | 7.9105 | 0.0352 | 224.73 | 4 |
| Ex. 49 | Sulfuric acid | 17.17 | 14.55 | 69.8 | 12.42 | 2 | 4.07 | 7.11 | 0.03 | 235.516 | 2 |

TABLE 3

| | | Etching solution | | | | | |
|---|---|---|---|---|---|---|---|
| | First acid | First acid concentration (mass %) | Silicon concentration (ppm) | Phosphoric acid concentration (mass %) | Water concentration (mass %) | Salt concentration (mol/L) | Phosphoric acid mass/ acid mass |
| Ex. 33 | Sulfuric acid | 0.29 | 63 | 84.74 | 14.97 | 0 | 292.21 |
| Ex. 34 | Sulfuric acid | 0.58 | 58 | 84.49 | 14.93 | 0 | 145.67 |
| Ex. 35 | Sulfuric acid | 1.45 | 46.5 | 83.72 | 14.83 | 0 | 57.74 |
| Ex. 36 | Sulfuric acid | 2.9 | 40 | 82.44 | 14.67 | 0 | 28.43 |
| Ex. 37 | Sulfuric acid | 5.78 | 34 | 79.88 | 14.34 | 0 | 13.82 |
| Ex. 38 | Sulfuric acid | 17.2 | 15 | 69.8 | 12.42 | 0 | 4.06 |
| Ex. 39 | Sulfuric acid | 28.33 | 5 | 59.91 | 11.75 | 0 | 2.11 |
| Ex. 40 | Sulfuric acid | 0.29 | 55 | 84.74 | 14.97 | 0 | 292.21 |
| Ex. 41 | Sulfuric acid | 0.58 | 45 | 84.49 | 14.93 | 0 | 145.67 |
| Ex. 42 | Sulfuric acid | 1.45 | 34 | 83.72 | 14.83 | 0 | 57.74 |
| Ex. 43 | Sulfuric acid | 2.9 | 28 | 82.44 | 14.67 | 0 | 28.43 |
| Ex. 44 | Sulfuric acid | 5.78 | 19 | 79.88 | 14.34 | 0 | 13.82 |
| Ex. 45 | Sulfuric acid | 17.2 | 7 | 69.8 | 12.42 | 0 | 4.06 |

TABLE 4

| | | Etching solution | | | | | | Evaluation result | | | |
|---|---|---|---|---|---|---|---|---|---|---|---|
| | | First | | Phosphoric | | | | | | | |
| | First acid | acid concentration (mass %) | Silicon concentration (ppm) | acid concentration (mass %) | Water concentration (mass %) | Salt concentration (mol/L) | Phosphoric acid mass/ acid mass | $ER_{SiN}$ (nm/ min) | $ER_{SiO}$ (nm/ min) | Selection ratio ($ER_{SiN}$/ $ER_{SiO}$) | Deposition level |
| Ex. A | Sulfuric acid | 1.7 | 44 | 94.18 | 4.12 | 0 | 55.40 | 7.388272444 | 0.105825022 | 69.81593095 | 1 |
| Ex. B | Sulfuric acid | 1.7 | 57.28 | 94.18 | 4.12 | 0 | 55.40 | 5.409 | 0.038240573 | 141.4466247 | 2 |
| Ex. C | Sulfuric acid | 1.7 | 95.86 | 94.18 | 4.12 | 0 | 55.40 | 6.5846 | 0.0105 | 627.1047619 | 2 |
| Ex. D | Sulfuric acid | 1.7 | 114.5 | 94.18 | 4.12 | 0 | 55.40 | 6.1703 | 0.013043208 | 473.0661232 | 2 |
| Ex. E | Sulfuric acid | 1.7 | 130 | 94.18 | 4.12 | 0 | 55.40 | 6.5485 | −0.003382889 | −1935.77153 | 4 |
| Ex. F | Sulfuric acid | 1.7 | 0 | 94.18 | 4.12 | 0 | 55.40 | — | — | — | 1 |

In Table 1 to Table 4, of the lower columns with a heading "Etching solution", the column labeled with "First acid" lists the kind of the acid having an acid dissociation exponent smaller than the first acid dissociation exponent $pK_{a1}$ of phosphoric acid. The columns labeled with "First acid concentration (mass %)", "Silicon concentration (ppm)", "Phosphoric acid concentration (mass %)", "Water concentration (mass %)", and "Salt concentration (mol/L)" list the concentration of the acid having an acid dissociation exponent smaller than the first acid dissociation exponent $pK_{a1}$ of phosphoric acid, the silicon concentration, the phosphoric acid concentration, the water concentration, and the sodium chloride concentration in the etching solution, respectively. The column labeled with "Phosphoric acid mass/acid mass" describes the ratio of the mass of phosphoric acid to the mass of the acid having an acid dissociation exponent smaller than the first acid dissociation exponent $pK_{a1}$ of phosphoric acid in the etching solution.

In Table 1, Table 2, and Table 4, of the lower columns with a heading of "Evaluation result", the column labeled with "$ER_{SiN}$ (nm/min)" and "$ER_{SiO}$ (nm/min)" list the etching rates of silicon nitride and silicon oxide, respectively. The column labeled with "Selection ratio ($ER_{SiN}$/$ER_{SiO}$)" lists the ratio of the etching rate of silicon nitride to the etching rate of silicon oxide. The column labeled with "Deposition level" lists the evaluation results of the above-described deposition level of silicon oxide.

As indicated in Table 1 and Table 2, using the etching solution including phosphoric acid, an acid having a dissociation exponent pK smaller than the first acid dissociation exponent $pK_{a1}$ of phosphoric acid, a silicic acid compound, and water, the etching solution having a ratio M1/M2 of 0.82 or more and 725 or less, in which M1 is the mass of phosphoric acid and the M2 is the mass of the acid, a higher selection ratio was able to be achieved in comparison with the case where an etching solution free from an acid having an acid dissociation exponent smaller than the first acid dissociation exponent $pK_{a1}$ of phosphoric acid, or a silicic acid compound.

The formula (1) and the formula (2) were calculated by carrying out JMP analysis on these experimental data. The contribution ratio $R^2$ according to the formula (1) was 0.8901. The contribution ratio $R^2$ according to the formula (2) was 0.8656.

In the formula (1), when the value of X is a reciprocal of 0.58, the value of Y is approximately 29.39. As given in Table 1 and FIG. 1, the selection ratios according to Example 3 to Example 9 in which the acid concentration in the etching solution having an acid dissociation exponent pK smaller than the first acid dissociation exponent $pK_{a1}$ of phosphoric acid and the concentration of silicon concentration were 0.58 mass % and 29.39 ppm or more, respectively, were higher than the selection ratios in Example 1 and Example 2 in which the silicon concentration was smaller than 29.39 ppm.

In the formula (1), when the value of X is a reciprocal of 1.45, the value of Y is approximately 24.62. As indicated in Table 1 and FIG. 1, the selection ratios according to Example 11 to Example 18 in which the acid concentration and the silicon concentration in the etching solution were 1.45 mass % and 24.62 ppm or more, respectively, were higher than the selection ratio according to Example 10 in which the silicon concentration was lower than 24.62 ppm.

In the formula (1), when the value of X is a reciprocal of 2.9, the value of Y is approximately 23.21. As indicated in Table 2 and FIG. 1, the selection ratio in Example 32 in which the acid concentration and the silicon concentration in the etching solution were 2.9 mass % and 23.21 ppm or more, respectively, was higher than the selection ratio in Example 31 in which the silicon concentration was lower than 23.21 ppm.

In the formula (2), when the value of X is a reciprocal of 5.78, the value of Y is approximately 17.44. As indicated in Table 2 and FIG. 1, the selection ratios in Example 29 and Example 30 in which the acid concentration and the silicon concentration in the etching solution were 5.78 mass % and 17.44 ppm or more, respectively, were higher than the selection ratio according to Example 28 in which the silicon concentration was lower than 17.44 ppm.

In the formula (2), when the value of X was a reciprocal of 17.17, the value of Y is approximately 10.22. As indicated in Table 1, Table 2, and FIG. 1, the selection ratios according to Example 21 to Example 25, Example 48, and Example 49 in which the acid concentration and the silicon concentration in the etching solution were 17.17 mass % and 10.22 ppm or more, respectively, were higher than the selection ratio according to Example 19 in which the silicon concentration was lower than 10.22 ppm. Additionally, the selection ratios according to Example 22, Example 23, Example 25, and Example 49 in which the silicon concentration was 13.5 ppm or more were higher than the selection ratio according to Example 19 to Example 21, Example 24, and Example 48 in which the silicon concentration was lower than 13.5 ppm.

The above-described formulae (3) and (4) were calculated by subjecting these experimental data to JMP analysis. The contribution ratio $R^2$ according to the formula (3) was 1. The contribution ratio $R^2$ according to the formula (4) was 0.9988.

In the formula (3), when the value of X is a reciprocal of 0.58, the value of Y is approximately 63.91. As indicated in Table 1 and FIG. 1, the deposition levels according to Example 2 to Example 8 in which the concentration of the acid having an acid dissociation exponent pK smaller than the first acid dissociation exponent $pK_{a1}$ of phosphoric acid and the silicon concentration in the etching solution were 0.58 mass % and 5 ppm or more 63.91 ppm or less, respectively, were 2 or 3, and deposition of silicon oxide was hardly observed. The deposition amount according to Example 9 in which the silicon concentration was higher than 63.91 ppm was higher than the deposition amount according to Example 2 to Example 8.

In the formula (4), when the value of X is a reciprocal of 1.45, the value of Y is approximately 59.22. As indicated in Table 1 and FIG. 1, the deposition levels according to Example 11 to Example 18 in which the acid concentration and the silicon concentration in the etching solution were 1.45 mass % and within the range of 5 ppm or more and 59.22 ppm or less, respectively, were 2 or 3, and deposition of silicon oxide was hardly observed.

In the formula (4), when the value of X is a reciprocal of 2.9, the value of Y is approximately 46.67. As indicated in Table 2 and FIG. 1, the deposition level according to Example 32 in which the acid concentration and the silicon concentration in the etching solution were 2.9 mass % and within the range of 5 ppm or more 46.67 ppm or less, respectively, were 3, and deposition of silicon oxide was hardly observed.

In the formula (4), when the value of X is a reciprocal of 5.78, the value of Y is approximately 34.18. As indicated in Table 2 and FIG. 1, the deposition level according to Example 29 in which the acid concentration and the silicon concentration in the etching solution were 5.78 mass % and within the range of 5 ppm or more and 34.18 ppm or less was 2, and deposition of silicon oxide was hardly observed.

In the formula (4), when the value of X is a reciprocal of 17.17, the value of Y is approximately 14.46. As indicated in Table 1, Table 2, and FIG. 1, the deposition level according to Example 20, Example 21, and Example 24 in which the acid concentration and the silicon concentration in the etching solution were 17.17 mass % and within the range of 5 ppm or more and 14.46 ppm or less, respectively, was 2, and deposition of silicon oxide was hardly observed.

Although detailed data are not given herein, in Example 33 to Example 45 listed in Table 3, the selection ratios according to Example 33 to Example 36 and Example 40 to Example 43 satisfying the formula (1), and Example 37 to Example 39 and Example 44 satisfying the formula (2) were higher than the selection ratio according to Example 45 which does not satisfy the formula (2).

In Example 33 to Example 45 listed in Table 3, the deposition levels according to Example 33, Example 34, Example 40, and Example 41 satisfying the formula (3), and Example 35 to Example 37, Example 39, and Example 42 to Example 45 satisfying the formula (4) were lower than the deposition level according to Example 38 which does not satisfy the formula (4).

As indicated in Table 4, using the etching solution including phosphoric acid, an acid having a dissociation exponent pK smaller than the first acid dissociation exponent $pK_{a1}$ of phosphoric acid, a silicic acid compound, and water, the etching solution having a ratio M1/M2 of 0.82 or more and 725 or less, in which M1 is the mass of phosphoric acid and the M2 is the mass of the acid, the concentration of the water being 5 mass % or less, a higher selection ratio was able to be achieved.

The selection ratios according to Example B to Example E in which the silicon concentration in the etching solution was 55 ppm or more were higher than the selection ratios according to Example A to Example F in which the silicon concentration was lower than 55 ppm.

The deposition levels according to Example B to Example D in which the silicon concentration in the etching solution was 55 ppm or more and 115 ppm or less were 2, and deposition of silicon oxide was hardly observed. On the other hand, the deposition level according to Example E in which the silicon concentration in the etching solution was higher than 115 ppm was 4, and deposition of silicon oxide was observed.

Example 100 to Example 121

Firstly, the substrate to be processed illustrated in FIG. 11 was prepared. The processing substrate was similar to those used in the etching process according to Example 1 to Example 49, except that the width of silicon nitride in a direction parallel to the main surface of the substrate and the width of silicon oxide in a direction parallel to the main surface of the substrate were smaller.

Subsequently, an etching solution having the composition given in Table 5 was prepared. The preparation of the etching solution used a 98 mass % phosphoric acid aqueous solution and a 98 mass % sulfuric acid aqueous solution. Additionally, silicon nitride was used as a silicic acid compound source.

Subsequently, using the etching process apparatus, the substrate to be processed was subjected to etching process. The temperature of the etching solution was 160° C.

<Measurement of Etching Rate>

The substrates after etching process obtained in Example 100 to Example 121 were observed with an electron microscope, thereby measuring the etching amounts of silicon nitride and silicon oxide. The etching amount herein means the decrement of the thickness in a direction perpendicular to the main surface of the substrate at the projections of silicon nitride and projections of silicon oxide provided on the both surfaces of the substrate.

Subsequently, the etching rate of silicon nitride $ER_{SiN}$ and the etching rate of silicon oxide $ER_{SiO}$ were calculated from the etching amounts of silicon nitride and silicon oxide per unit time. In some examples, the sign of the etching rate of silicon oxide $ER_{SiO}$ was negative. The etching rate of silicon oxide $ER_{SiO}$ having a negative sign is considered to mean the deposition amount of silicon oxide per unit time.

Subsequently, the ratio of the etching rate of silicon nitride $ER_{SiN}$ to the etching rate of silicon oxide $ER_{SiO}$ was determined, and the selection ratio $ER_{SiN}/ER_{SiO}$ was calculated. In the example in which the sign of the etching rate of silicon oxide $ER_{SiO}$ was negative, the sign of the selection ratio was negative. The high selection ratio herein means the high absolute value of the selection ratio.

The results are listed in Table 5.

<Evaluation of Deposition Level>

The substrates after etching process obtained in Example 100 to Example 121 were observed with an electron microscope, thereby evaluating the deposition level of silicon oxide. In this evaluation, the condition where the ratio of the width W1 at the tip of the projections of silicon oxide in a direction parallel to the main surface of the substrate after etching process to the width W0 at the tip of the projections of silicon oxide in a direction parallel to the main surface of the substrate before etching process, or ratio W1/W0 was smaller than 0.8, more specifically, the side etching amount was large was defined as the deposition level 0.

Additionally, the condition where the ratio W1/W0 was within the range of more than 0.8 and 0.9 or less was defined as the deposition level 1. The condition where the ratio W1/W0 was within the range of more than 0.9 and 0.97 or less was defined as the deposition level 1.9. The condition where the ratio W1/W0 was within the range of more than 0.97 and 1.05 or less was defined as the deposition level 2. The condition where the ratio W1/W0 was within the range of more than 1.05 and 1.1 or less was defined as the deposition level 2.1. The condition where the ratio W1/W0 was within the range of more than 1.1 and 1.3 or less was defined as the deposition level 2.5. The condition where the ratio W1/W0 was within the range of more than 1.7 and 2 or less was defined as the deposition level 4.5. The condition where the ratio W1/W0 was 2 or more and the trench T illustrated in FIG. 13 was completely blocked by the deposit 201 was defined as the deposition level 5.

The width W1 at the tip was obtained by, when deposition was observed on the projections of silicon oxide, adding the width X of the deposit 201 illustrated in FIG. 13 to the width W0 at the tip of the projections of silicon oxide in a direction parallel to the main surface of the substrate before etching process.

The results are listed in Table 5.

TABLE 5

| | Etching solution | | | | | Evaluation result | | | |
|---|---|---|---|---|---|---|---|---|---|
| | First | | | Phosphoric | | | | | |
| | First acid | acid concentration (mass %) | Silicon concentration (ppm) | acid concentration (mass %) | Water concentration (mass %) | Phosphoric acid mass/ acid mass | $ER_{SiN}$ (nm/min) | $ER_{SiO}$ (nm/min) | Selection ratio ($ER_{SiN}$/ $ER_{SiO}$) | Deposition level |
| Ex. 100 | Sulfuric acid | 2 | 31.14 | 89 | 9 | 44.50 | 7.844 | 0.1288 | 60.90062112 | 1 |
| Ex. 101 | Sulfuric acid | 2 | 50.63 | 89 | 9 | 44.50 | 8.502 | 0.08138 | 104.4728435 | 1.9 |
| Ex. 102 | Sulfuric acid | 2 | 59.63 | 89 | 9 | 44.50 | 8.582748148 | 0.048306149 | 177.674031 | 2 |
| Ex. 103 | Sulfuric acid | 2 | 70.27579663 | 89 | 9 | 44.50 | 7.867166667 | 0.043414376 | 181.2110955 | 2 |
| Ex. 104 | Sulfuric acid | 2 | 79.71892019 | 89 | 9 | 44.50 | 8.031866667 | 0.019130076 | 419.8554526 | 2.1 |
| Ex. 105 | Sulfuric acid | 2 | 91.62909875 | 89 | 9 | 44.50 | 9.231844864 | 0.006486427 | 1423.255752 | 2.5 |
| Ex. 106 | Sulfuric acid | 2 | 131.03 | 89 | 9 | 44.50 | 8.685016667 | 0.0001 | 86850.16667 | 4.5 |
| Ex. 107 | Sulfuric acid | 2.83 | 33.79278794 | 89 | 8.17 | 31.45 | 8.106433333 | 0.190686447 | 42.51184839 | 1 |
| Ex. 108 | Sulfuric acid | 2.83 | 49.47 | 89 | 8.17 | 31.45 | 8.307366667 | 0.034337662 | 241.9316306 | 2 |
| Ex. 109 | Sulfuric acid | 2.83 | 78.82255589 | 89 | 8.17 | 31.45 | 7.941555878 | 0.048607948 | 163.3797813 | 2 |

TABLE 5-continued

| | | Etching solution | | | | | Evaluation result | | | |
|---|---|---|---|---|---|---|---|---|---|---|
| | | First | | Phosphoric | | | | | | |
| | First acid | acid concentration (mass %) | Silicon concentration (ppm) | acid concentration (mass %) | Water concentration (mass %) | Phosphoric acid mass/ acid mass | $ER_{SiN}$ (nm/min) | $ER_{SiO}$ (nm/min) | Selection ratio ($ER_{SiN}$/ $ER_{SiO}$) | Deposition level |
| Ex. 110 | Sulfuric acid | 2.83 | 81.15743122 | 89 | 8.17 | 31.45 | 8.1768 | 0.050832885 | 160.8565015 | 2 |
| Ex. 111 | Sulfuric acid | 2.83 | 96.02332871 | 89 | 8.17 | 31.45 | 7.441979812 | 0.044726861 | 166.3872587 | 2 |
| Ex. 112 | Sulfuric acid | 3 | 52.68245598 | 89 | 8 | 29.67 | 6.63485 | 0.092654636 | 71.60839717 | 1 |
| Ex. 113 | Sulfuric acid | 3 | 79.04230762 | 89 | 8 | 29.67 | 6.636413647 | 0.043747452 | 151.6982887 | 1.9 |
| Ex. 114 | Sulfuric acid | 3 | 127.6989066 | 89 | 8 | 29.67 | 6.564266285 | 0.021816282 | 300.8884015 | 2 |
| Ex. 115 | Sulfuric acid | 3 | 150.83342 | 89 | 8 | 29.67 | 6.607312158 | 0.020788978 | 317.8276633 | 2 |
| Ex. 116 | Sulfuric acid | 3 | 155.0365193 | 89 | 8 | 29.67 | 7.438233333 | 0.018709172 | 397.5714931 | 2 |
| Ex. 117 | Sulfuric acid | 3 | 177.02 | 89 | 8 | 29.67 | 7.431519922 | 0.00048 | 15482.33317 | 5 |
| Ex. 118 | Sulfuric acid | 4.07 | 50.57802153 | 89 | 6.93 | 21.87 | 6.369816667 | 0.123664441 | 51.50887842 | 1 |
| Ex. 119 | Sulfuric acid | 4.07 | 85.17058963 | 89 | 6.93 | 21.87 | 6.920270198 | 0.103159959 | 67.0829095 | 1 |
| Ex. 120 | Sulfuric acid | 8.37 | 50.62 | 89 | 2.63 | 10.63 | 4.636184494 | 0.3786688 | 12.24337597 | 0 |
| Ex. 121 | Sulfuric acid | 8.37 | 82.35004554 | 89 | 2.63 | 10.63 | 4.509216667 | 0.281951757 | 15.99286597 | 0 |

In Table 5, of the lower columns with a heading "Etching solution", the column labeled with "First acid" lists the kind of the acid having an acid dissociation exponent smaller than the first acid dissociation exponent $pK_{a1}$ of phosphoric acid. The columns labeled with "First acid concentration (mass %)", "Silicon concentration (ppm)", "Phosphoric acid concentration (mass %)", and "Water concentration (mass %)" list the concentration of the acid having an acid dissociation exponent smaller than the first acid dissociation exponent $pK_{a1}$ of phosphoric acid, the silicon concentration, the phosphoric acid concentration, and the water concentration in the etching solution, respectively. The column labeled with "Phosphoric acid mass/acid mass" lists the ratio of the mass of phosphoric acid to the mass of the acid having an acid dissociation exponent smaller than the first acid dissociation exponent $pK_{a1}$ of phosphoric acid in the etching solution.

In Table 5, of the lower columns with a heading "Evaluation result", the column labeled with "$ER_{SiN}$(nm/min)" and "$ER_{SiO}$ (nm/min)" list the etching rates of silicon nitride and silicon oxide, respectively. The column labeled with "Selection ratio ($ER_{SiN}$/$ER_{SiO}$)" lists the ratio of the etching rate of silicon nitride to the etching rate of silicon oxide. The column labeled with "Deposition level" lists the evaluation results of the above-described deposition level of silicon oxide.

As indicated in Table 5, the etching rate of silicon nitride, the selection ratio, and the deposition level in Example 100 to Example 121 using an etching solution including phosphoric acid, an acid having an acid dissociation exponent smaller than the first acid dissociation exponent $pK_{a1}$ of phosphoric acid, a silicic acid compound, and water, having an acid concentration of 1 mass % or more and 5 mass % or less, and a water concentration of 4 mass % or more and 11 mass % or less were better than the etching rate of silicon nitride, the selection ratio, and the deposition level according to Example 120 and Example 121 in which the acid concentration was higher than 5 mass % and the water concentration was lower than 5 mass %.

The formula (10) to the formula (40) were calculated from the date listed in Table 5. The contribution ratio $R^2$ according to the formula (10) was 0.975. The contribution ratio $R^2$ according to the formula (20) was 0.9926. The contribution ratio $R^2$ according to the formula (30) was 0.9785. The contribution ratio $R^2$ according to the formula (40) was 0.9926. In Example 101 to Example 105, Example 108 to Example 111, and, Example 113 to Example 116 using the etching solution having a silicon concentration of within the range of Y10 ppm or more and Y20 ppm or less and within the range of Y30 ppm or more and Y40 ppm or less, the deposition level was 1.9 or more 2.5 or less, and the substrates having a desired shape were able to be obtained.

Example 200 to Example 202

Firstly, as a base material, a single crystal silicon square plate with one side of 2.5 cm was prepared. Subsequently, a silicon oxide film was formed on the base material, and a silicon nitride film was further formed thereon, thus obtaining a processing substrate. The film thickness of silicon oxide was 0.1 μm, and the film thickness of silicon nitride was 0.4 μm to 0.5 μm.

Subsequently, a 98 mass % phosphoric acid aqueous solution, a 40 mass % hexafluorosilicic acid aqueous solution (Wako Pure Chemical Industries, Ltd.), a 98 mass % sulfuric acid aqueous solution, and water were mixed in a glass beaker, thereby preparing the etching solution having the composition given in Table 11. The 98 mass % phosphoric acid aqueous solution was prepared by heating an 85 mass % phosphoric acid aqueous solution. The inner wall of the glass beaker was coated with a tetrafluoroethylene-perfluoroalkyl vinyl ether copolymer (PFA).

Subsequently, the beaker was equipped with a cover and a reflux cooling tube, and heated while the etching solution was stirred using a mantle heater stirrer at a rate of 100 rpm. Subsequently, after the temperature of the etching solution reached a predetermined temperature, the processing substrate was immersed in the etching solution, the etching solution was stirred at a rate of 100 rpm for 12 minutes, thereby carrying out etching process. Subsequently, the processing substrate was taken out from the etching solution, the processing substrate was washed with pure water for one minute, and then nitrogen ($N_2$) gas was blown on the processing substrate, thereby drying the processing substrate.

Example 300 to Example 312

Etching process was carried out in the same manner as in Example 200 to Example 202, except that the composition of the etching solution and the etching process temperature where changed to those listed in Table 12.

Example 400 to Example 404

Etching process was carried out in the same manner as in Example 200 to Example 202, except that the composition of the etching solution and the etching process temperature where changed to those listed in Table 13. A 49 mass % hydrogen fluoride aqueous solution was used as HF.

Example 500 to Example 504

Etching process was carried out in the same manner as in Example 400 to Example 404, except that the composition of the etching solution and the etching process temperature where changed to those listed in Table 14.

<Measurement of Etching Rate>

For the substrates before etching process and the substrates after process obtained in Example 200 to Example 202, Example 300 to Example 312, Example 400 to Example 404, and Example 500 to Example 504, the film thickness of silicon nitride and the film thickness of silicon oxide were measured using a spectroscopic ellipsometer (M-2000, manufactured by J. A. Woollam). The measurement was carried out at nine points, and the average thus obtained was divided by the process time, thereby calculating the etching rate of silicon nitride $ER_{SiN}$ and the etching rate of silicon oxide $ER_{SiO}$.

Subsequently, the ratio of the etching rate of silicon nitride $ER_{SiN}$ to the etching rate of silicon oxide $ER_{SiO}$ was determined, and the selection ratio $ER_{SiN}/ER_{SiO}$ was calculated. The results are listed in Table 11 to Table 14.

<Evaluation of Degree of Deposition>

For Example 200 to Example 202, Example 300 to Example 312, Example 400 to Example 404, and Example 500 to Example 504, the degree of deposition was evaluated. Specifically, the amount of the white substance deposited in the etching solution after etching process was confirmed by visual observation. At this time, those gave little deposition or no deposition were rated as the degree of deposition of 1, those gave a little deposition were rated as the degree of deposition of 2, and those gave a large amount of deposition were rated as the degree of deposition of 3. The results are listed in Table 11 to Table 14.

<General Evaluation>

For Example 200 to Example 202, Example 300 to Example 312, Example 400 to Example 404, and Example 500 to Example 504, those satisfying all of the following requirements: the etching rate of silicon nitride $ER_{SiN}$ is 15.00 nm/min or more; the selection ratio is 15 or more; and the degree of deposition is 1 or 2, received a general evaluation rating of A, those satisfying two of these requirements received a general evaluation of B, and those satisfying one or none of these requirements received a general evaluation rating of C. The results are listed in Table 11 to Table 14.

TABLE 11

| | Etching solution | | | | | | Evaluation result | | | | |
| | | | | | | | | | Selection | | |
| | $H_3PO_4$ (mass %) | $H_2SO_4$ (mass %) | $H_2SiF_6$ (mass %) | HF (mass %) | $H_2O$ (mass %) | temperature (° C.) | $ER_{SiN}$ (nm/min) | $ER_{SiO}$ (nm/min) | ratio ($ER_{SiN}/ER_{SiO}$) | Deposition level | General evaluation |
|---|---|---|---|---|---|---|---|---|---|---|---|
| Ex. 200 | 92.73 | 0.00 | 0.118 | 0.00 | 7.16 | 163 | 13.01 | 0.40 | 33 | 3 | C |
| Ex. 201 | 91.88 | 0.00 | 0.695 | 0.00 | 7.43 | 163 | 36.24 | 3.07 | 12 | 3 | C |
| Ex. 202 | 88.43 | 0.00 | 0.255 | 0.00 | 11.31 | 163 | 32.29 | 3.04 | 11 | 3 | C |

TABLE 12

| | Etching solution | | | | | | Evaluation result | | | | |
| | | | | | | | | | Selection | | |
| | $H_3PO_4$ (mass %) | $H_2SO_4$ (mass %) | $H_2SiF_6$ (mass %) | HF (mass %) | $H_2O$ (mass %) | temperature (° C.) | $ER_{SiN}$ (nm/min) | $ER_{SiO}$ (nm/min) | ratio ($ER_{SiN}/ER_{SiO}$) | Deposition level | General evaluation |
|---|---|---|---|---|---|---|---|---|---|---|---|
| Ex. 300 | 91.78 | 0.71 | 0.105 | 0.00 | 7.41 | 165 | 22.74 | 0.28 | 81 | 3 | B |
| Ex. 301 | 91.84 | 0.71 | 0.202 | 0.00 | 7.25 | 165 | 21.90 | 0.00 | ∞ | 3 | B |
| Ex. 302 | 91.50 | 0.70 | 0.351 | 0.00 | 7.44 | 165 | 28.05 | 0.00 | ∞ | 3 | B |
| Ex. 303 | 91.14 | 0.70 | 0.505 | 0.00 | 7.65 | 165 | 38.07 | 0.58 | 66 | 3 | B |
| Ex. 304 | 88.76 | 5.00 | 0.184 | 0.00 | 6.05 | 165 | 15.09 | 0.24 | 63 | 1 | A |
| Ex. 305 | 83.77 | 10.00 | 0.184 | 0.00 | 6.04 | 165 | 15.35 | 0.10 | 154 | 1 | A |
| Ex. 306 | 73.74 | 20.00 | 0.184 | 0.00 | 6.07 | 165 | 12.97 | 0.00 | ∞ | 1 | B |
| Ex. 307 | 63.77 | 30.00 | 0.184 | 0.00 | 6.03 | 165 | 11.32 | 0.00 | ∞ | 1 | B |
| Ex. 308 | 63.84 | 30.00 | 0.100 | 0.00 | 6.06 | 165 | 10.36 | 0.00 | ∞ | 1 | B |
| Ex. 309 | 63.69 | 30.00 | 0.250 | 0.00 | 6.05 | 165 | 14.09 | 0.69 | 20 | 2 | B |
| Ex. 310 | 76.76 | 17.00 | 0.18 | 0.00 | 6.05 | 165 | 14.46 | 0.00 | ∞ | 1 | B |
| Ex. 311 | 80.84 | 13.00 | 0.10 | 0.00 | 6.04 | 165 | 12.98 | 0.00 | ∞ | 1 | B |
| Ex. 312 | 80.67 | 13.00 | 0.25 | 0.00 | 6.09 | 165 | 18.59 | 0.00 | ∞ | 3 | B |

TABLE 13

| | Etching solution | | | | | | Evaluation result | | | | |
|---|---|---|---|---|---|---|---|---|---|---|---|
| | $H_3PO_4$ (mass %) | $H_2SO_4$ (mass %) | $H_2SiF_6$ (mass %) | HF (mass %) | $H_2O$ (mass %) | temperature (° C.) | $ER_{SiN}$ (nm/min) | $ER_{SiO}$ (nm/min) | Selection ratio ($ER_{SiN}/ER_{SiO}$) | Deposition level | General evaluation |
| Ex. 400 | 87.72 | 5.00 | 0.15 | 0.04 | 7.07 | 160 | 12.17 | 0.64 | 19 | 1 | B |
| Ex. 401 | 88.61 | 5.00 | 0.25 | 0.05 | 6.09 | 165 | 23.26 | 0.80 | 29 | 2 | A |
| Ex. 402 | 88.74 | 5.00 | 0.15 | 0.05 | 6.05 | 165 | 20.12 | 0.85 | 24 | 1 | A |
| Ex. 403 | 93.11 | 0.70 | 0.10 | 0.03 | 6.06 | 165 | 12.21 | 0.74 | 17 | 1 | B |
| Ex. 404 | 93.11 | 0.70 | 0.10 | 0.03 | 6.06 | 150 | 4.85 | 0.30 | 16 | 1 | B |

TABLE 14

| | Etching solution | | | | | | Evaluation result | | | | |
|---|---|---|---|---|---|---|---|---|---|---|---|
| | $H_3PO_4$ (mass %) | $H_2SO_4$ (mass %) | $H_2SiF_6$ (mass %) | HF (mass %) | $H_2O$ (mass %) | temperature (° C.) | $ER_{SiN}$ (nm/min) | $ER_{SiO}$ (nm/min) | Selection ratio ($ER_{SiN}/ER_{SiO}$) | Deposition level | General evaluation |
| Ex. 500 | 46.26 | 47.55 | 0.00 | 0.10 | 6.09 | 158 | 8.24 | 2.20 | 4 | 1 | C |
| Ex. 501 | 63.78 | 30.03 | 0.00 | 0.10 | 6.09 | 159 | 7.84 | 1.30 | 6 | 1 | C |
| Ex. 502 | 78.79 | 15.02 | 0.00 | 0.10 | 6.09 | 159 | 9.84 | 2.20 | 4 | 1 | C |
| Ex. 503 | 86.80 | 7.01 | 0.00 | 0.10 | 6.09 | 159 | 10.32 | 2.20 | 5 | 1 | C |
| Ex. 504 | 93.81 | 0 | 0.00 | 0.10 | 6.09 | 159 | 11.05 | 2.23 | 5 | 1 | C |

In Table 11 to Table 14, of the lower columns with a heading "Etching solution", the columns labeled with "$H_3PO_4$ (mass %)", "$H_2SO_4$ (mass %)", "$H_2SiF_6$ (mass %)", "HF (mass %)", and "$H_2O$ (mass %)" list the phosphoric acid concentration, the sulfuric acid concentration, the hexafluorosilicic acid concentration, the hydrogen fluoride concentration, and the water concentration in the etching solution, respectively. Additionally, the column labeled with "Temperature (° C.)" lists the temperature of the etching process.

In Table 11 to Table 14, of the lower columns with a heading "Evaluation result", the columns labeled with "$ER_{SiN}$ (nm/min)" and "$ER_{SiO}$ (nm/min)" list the etching rate of silicon nitride and the etching rate of silicon oxide, respectively. The column labeled with "Selection ratio ($ER_{SiN}/ER_{SiO}$)" lists the ratio of the etching rate of silicon nitride to the etching rate of silicon oxide. The column labeled with "Degree of deposition" lists the evaluation result of the above-described degree of deposition of silicon oxide. The column labeled with "General evaluation" lists the above-described general evaluation result.

As indicated in Table 11, in Example 200 to Example 202 using the etching solution free from an acid having an acid dissociation exponent smaller than the first acid dissociation exponent $pK_{a1}$ of phosphoric acid, the degrees of deposition were high, the general evaluation rating was C, and a well-balanced etching process was not achieved. In Example 200 in which the hexafluorosilicic acid concentration was low, the selection ratio was high, but the etching rate of silicon nitride was low. In Examples 201 and 202 in which the hexafluorosilicic acid concentration was high, the etching rate of silicon nitride was high, but the selection ratio was low.

As indicated in Table 12, Example 300 to Example 312 using the etching solution including phosphoric acid, an acid having an acid dissociation exponent smaller than the first acid dissociation exponent $pK_{a1}$ of phosphoric acid, hexafluorosilicic acid, and water were able to receive a general evaluation rating of A or B, and achieve a well-balanced etching process. In particular, Example 304 and Example 305 using the etching solution having a sulfuric acid concentration of 5 mass % or more and 15 mass % or less and a hexafluorosilicic acid concentration of 0.15 mass % or more and 0.20 mass % or less received a general evaluation rating of A, and achieved a high etching rate of silicon nitride, a high selection ratio, and suppression of deposition of silicon oxide.

As indicated in Table 13, in Example 400 to Example 404 using the etching solution prepared by adding hydrogen fluoride to an etching solution including phosphoric acid, an acid having an acid dissociation exponent smaller than the first acid dissociation exponent $pK_{a1}$ of phosphoric acid, hexafluorosilicic acid, and water were able to receive a general evaluation rating of A or B, and achieve a well-balanced etching process. In particular, Example 401 and 402 using the etching solution in which the sulfuric acid concentration was 5 mass % or more, the hexafluorosilicic acid concentration was 0.15 mass % or more, and the hydrogen fluoride concentration was 0.05 mass % or more were able to receive the general evaluation of A, and achieve a high etching rate of silicon nitride, a high selection ratio, and suppression of deposition of silicon oxide.

As indicated in Table 14, in Example 500 to Example 504 using the etching solution free from hexafluorosilicic acid, all the general evaluations were C, and well-balanced etching process was not able to be achieved. In Example 500 to Example 504, no hexafluorosilicic acid was included, so that silicic acid was hardly formed, and deposition of silicon oxide did not occur, but the etching rate of silicon nitride did not improve. Additionally, owing to the use of hydrogen fluoride, the etching rate of silicon oxide increased, and the selection ratio was very low.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An etching solution suitable for etching silicon nitride, the solution comprising:
   phosphoric acid having a first acid dissociation exponent $pK_{a1}$;
   a second acid having an acid dissociation exponent smaller than the first acid dissociation exponent $pK_{a1}$;
   a silicic acid compound;
   and water,
   wherein the silicic acid compound comprises a monomer or multimer of formula (I)

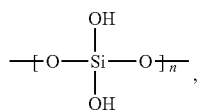

n being an integer in a range of from 1 to 5,
   wherein a mass ratio M1/M2 of mass M1 of the phosphoric acid to mass M2 of the second acid is in a range of from 0.82 to 725, and
   wherein the second acid is at least one selected from the group consisting of sulfuric acid, hydrochloric acid, and trifluorosulfonic acid.

2. The solution of claim 1, having a silicon concentration in a range of from 5 to 98 ppm.

3. The solution of claim 1, wherein the silicon concentration of the etching solution is Y1 ppm or more when a concentration of the second acid is in a range of from 0.11 to 2.9 mass %,
   wherein the silicon concentration of the etching solution is Y2 ppm or more when the concentration of the second acid is in a range of from more than 2.9 to 28.33 mass %, and
   wherein the silicon concentration of the etching solution is 5 ppm or more when the concentration of the second acid is within a range of from more than 28.33 to 48.3 mass %, and
   wherein Y1 is of formula (1), Y2 is of formula (2), and x is a reciprocal of a value of the concentration of the second acid:

$$Y1 = 21.876 \times e^{0.712x} \quad (1), \text{ and}$$

$$Y2 = 6.6356 \times \log_e(X) + 29.083 \quad (2).$$

4. The solution of claim 1, wherein the silicon concentration is within a range of 5 ppm or more and Y3 ppm or less when the concentration of the second acid is in a range of from 0.11 to 0.58 mass %, and
   wherein the silicon concentration is in a range of from 5 ppm to Y4 ppm when the concentration of the second acid is in a range of from more than 0.58 to 28.33 mass %, and
   wherein Y3 is of formula (3), Y4 is of formula (4), and X is a reciprocal of a value of the concentration of the second acid:

$$Y3 = 18.958 \times \log_e(X) + 53.583 \quad (3), \text{ and}$$

$$Y4 = 18.111 \times \log_e(X) + 65.953 \quad (4).$$

5. The solution of claim 4, wherein the silicon concentration is within a range of from the Y1 ppm to the Y3 ppm when the concentration of the second acid is in a range of from 0.11 to 0.58 mass %,
   wherein the silicon concentration is within a range of from the Y1 to the Y4 ppm when the concentration of the second acid is in a range of from more than 0.58 to 2.9 mass %, and
   wherein the silicon concentration is within a range of from the Y2 ppm to the Y4 ppm when the concentration of the second acid is in a range of from more than 2.9 to 28.33 mass %,
   wherein Y1 of formula (1), the Y2 is of formula (2), and x is a reciprocal of a value of the concentration of the second acid:

$$Y1 = 21.876 \times e^{0.1712x} \quad (1), \text{ and}$$

$$Y2 = 6.6356 \times \log_e(X) + 29.083 \quad (2).$$

6. The solution of claim 1, wherein a water concentration of the etching solution is 12 mass % or less.

7. The solution of claim 1, wherein a concentration of the phosphoric acid is in a range of from 60 to 85 mass %,
   wherein a concentration of the second acid is in a range of from 0.1 to 28.33 mass %, and
   wherein a concentration of the water is in a range of from 4 to 17 mass %.

8. The solution of claim 1, wherein the second acid comprises the sulfuric acid.

9. The solution of claim 1, wherein the second acid comprises the hydrochloric acid.

10. An etching method, comprising:
    etching of silicon nitride using the solution of claim 1.

11. A method for manufacturing an electronic component, the method comprising:
    etching of silicon nitride using the solution of claim 1.

12. A method for manufacturing an electronic component, the method comprising:
    etching a silicon nitride layer from a substrate by the method of claim 11, the substrate comprising the silicon nitride layer and a silicon oxide layer; and
    depositing a conductive material on at least a portion of an area from which the silicon nitride layer has been removed.

13. An etching solution suitable for etching silicon nitride, the solution comprising:
    phosphoric acid having a first acid dissociation exponent $pK_{a1}$;
    a second acid having an acid dissociation exponent smaller than the first acid dissociation exponent $pK_{a1}$;
    a silicic acid compound;
    a salt comprising a monovalent cation having a hydration number of 3.5 or less; and
    water,
    wherein a mass ratio M1/M2 of mass M1 of the phosphoric acid to mass M2 of the second acid is in a range of from 0.82 to 725,
    wherein the second acid is at least one selected from the group consisting of sulfuric acid, hydrochloric acid, and trifluorosulfonic acid, and
    wherein a concentration of the salt is in a range of from 0.05 to 2 mol/L.

14. An etching solution suitable for etching silicon nitride, the etching solution comprising:
    phosphoric acid having a first acid dissociation exponent $pK_{a1}$;

a second acid having an acid dissociation exponent smaller than the first acid dissociation exponent $pK_a$;
a silicic acid compound;
and water,
wherein a concentration of the phosphoric acid is in a range of from 88 to 95 mass %,
wherein a concentration of the second acid is in a range of from 1 to 5 mass %,
wherein a concentration of the water is in a range of from 4 to 11 mass %,
wherein the second acid is at least one selected from the group consisting of sulfuric acid, hydrochloric acid, and trifluorosulfonic acid, and
wherein the silicic acid compound comprises a monomer or multimer of formula (I)

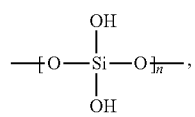

n being an integer in a range of from 1 to 5.

15. The solution of claim 14, having a silicon concentration in a range of from 40 to 160 ppm.

16. The solution of claim 14, having a silicon concentration in a range of from 40 to 100 ppm.

17. The solution of claim 14, wherein the concentration of the second acid is in a range of from 1.0 to 4.0 mass %.

18. The solution of claim 14, wherein the concentration of the water is in a range of from 6.0 to 9.0 mass %.

19. An etching method, comprising:
etching of silicon nitride using the solution of claim 14.

20. A method for manufacturing an electronic component, the method comprising:
etching of silicon nitride using the solution of claim 14.

21. A method for manufacturing an electronic component, the method comprising:
etching a silicon nitride layer from a substrate by the method of claim 19, the substrate comprising the silicon nitride layer and a silicon oxide layer; and
depositing a conductive material on at least a portion of an area from which the silicon nitride layer has been removed.

22. An etching solution suitable for etching silicon nitride, the etching solution comprising:
phosphoric acid having a first acid dissociation exponent $pK_{a1}$;
a second acid having an acid dissociation exponent smaller than the first acid dissociation exponent $pK_{a1}$;
hexafluorosilicic acid;
hydrogen fluoride; and
water,
wherein the second acid is at least one selected from the group consisting of sulfuric acid, hydrochloric acid, and trifluorosulfonic acid.

23. The solution of claim 22, wherein a concentration of the second acid is in a range of from 5 to 30 mass %.

24. The solution of claim 22, wherein a concentration of the hexafluorosilicic acid is in a range of from 0.1 to 0.2 mass %.

25. The solution of claim 22, wherein a concentration of the phosphoric acid is in a range of from 63 to 89 mass %.

26. The solution of claim 22, wherein a concentration of the phosphoric acid is in a range of from 63 to 89 mass %,
wherein a concentration of the second acid is in a range of from 0.7 to 30 mass %,
wherein a concentration of the water is in a range of from 6 to 8 mass %, and
wherein a concentration of the hexafluorosilicic acid is in a range of from 0.1 to 0.71 mass %.

27. An etching method, comprising:
etching of silicon nitride using the solution of claim 22.

28. A method for manufacturing an electronic component, the method comprising:
etching of silicon nitride using the solution of claim 22.

29. A method for manufacturing an electronic component, the method comprising:
etching a silicon nitride layer from a substrate by the method of claim 27, the substrate comprising the silicon nitride layer and a silicon oxide layer; and
depositing a conductive material on at least a portion of an area from which the silicon nitride film has been removed.

30. An etching solution suitable for etching silicon nitride, the etching solution comprising:
phosphoric acid having a first acid dissociation exponent $pK_{a1}$;
a second acid having an acid dissociation exponent smaller than the first acid dissociation exponent $pK_{a2}$;
a silicic acid compound;
a salt comprising a monovalent cation having a hydration number of 3.5 or less; and
water,
wherein a concentration of the phosphoric acid is in a range of from 88 to 95 mass %,
wherein a concentration of the second acid is in a range of from 1 to 5 mass %,
wherein a concentration of the water is in a range of from 4 to 11 mass %,
wherein a concentration of the salt is in a range of from 0.05 to 2 mol/L, and
wherein the second acid is at least one selected from the group consisting of sulfuric acid, hydrochloric acid, and trifluorosulfonic acid.

* * * * *